(12) United States Patent
Takayama

(10) Patent No.: US 9,214,789 B2
(45) Date of Patent: Dec. 15, 2015

(54) SEMICONDUCTOR LIGHT EMITTING ELEMENT

(71) Applicant: Panasonic Intellectual Property Management Co., Ltd., Osaka (JP)

(72) Inventor: Toru Takayama, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/688,746

(22) Filed: Apr. 16, 2015

(65) Prior Publication Data

US 2015/0229104 A1 Aug. 13, 2015

Related U.S. Application Data

(63) Continuation of application No. PCT/JP2013/002544, filed on Apr. 15, 2013.

(30) Foreign Application Priority Data

Oct. 19, 2012 (JP) ................................. 2012-231383

(51) Int. Cl.

| H01S 5/00 | (2006.01) |
|---|---|
| H01S 5/343 | (2006.01) |
| H01S 5/323 | (2006.01) |
| H01S 5/02 | (2006.01) |
| H01S 5/22 | (2006.01) |
| H01S 5/30 | (2006.01) |
| H01S 5/34 | (2006.01) |
| H01S 5/223 | (2006.01) |
| H01S 5/32 | (2006.01) |

(52) U.S. Cl.
CPC ............ *H01S 5/34333* (2013.01); *H01S 5/0206* (2013.01); *H01S 5/22* (2013.01); *H01S 5/3013* (2013.01); *H01S 5/32341* (2013.01); *H01S 5/3407* (2013.01); *H01S 5/2231* (2013.01); *H01S 5/3213* (2013.01); *H01S 2301/173* (2013.01)

(58) Field of Classification Search
USPC ............................... 372/43.01–45.01, 45.011
See application file for complete search history.

(56) References Cited

U.S. PATENT DOCUMENTS

| 6,252,894 B1 * | 6/2001 | Sasanuma ............. H01S 5/2231 372/45.01 |
| 2002/0014674 A1 | 2/2002 | Hideyoshi et al. |

(Continued)

FOREIGN PATENT DOCUMENTS

| JP | 2002-270971 A | 9/2002 |
| JP | 2004-014818 A | 1/2004 |
| JP | 2011-003661 A | 1/2011 |

OTHER PUBLICATIONS

International Search Report issued in PCT/JP2013/002544, dated Jul. 16, 2013, with English translation.

*Primary Examiner* — Dung Nguyen

(74) *Attorney, Agent, or Firm* — McDermott Will & Emery LLP

(57) ABSTRACT

A semiconductor light emitting element includes a substrate including GaN, a first cladding layer provided over the substrate, a quantum well active layer provided over the first cladding layer, a second cladding layer provided over the quantum well active layer, and a first refractive index correction layer provided between the substrate and the first cladding layer. The first refractive index correction layer includes a layer of $In_{1-x-y}Al_yGa_xN$ (where x+y<1), and x and y satisfy the relations $x/1.05+y/0.69>1$, $x/1.13+y/0.49>1$, or $x/1.54+y/0.24>1$, and the relations $x/0.91+y/0.75 \geq 1$ and $x/1.08+y/0.91 \leq 1$.

19 Claims, 17 Drawing Sheets

(56) References Cited

U.S. PATENT DOCUMENTS

| | | | |
|---|---|---|---|
| 2004/0184496 A1* | 9/2004 | Kneissl | B82Y 20/00 372/45.01 |
| 2006/0133439 A1 | 6/2006 | Yamasaki | |
| 2010/0232466 A1 | 9/2010 | Ichinokura et al. | |
| 2010/0320488 A1* | 12/2010 | Horie | H01L 27/153 257/91 |

\* cited by examiner

FIG.11A  Refractive Index of Al₀.₁Ga₀.₉N at Wavelength of 430 nm
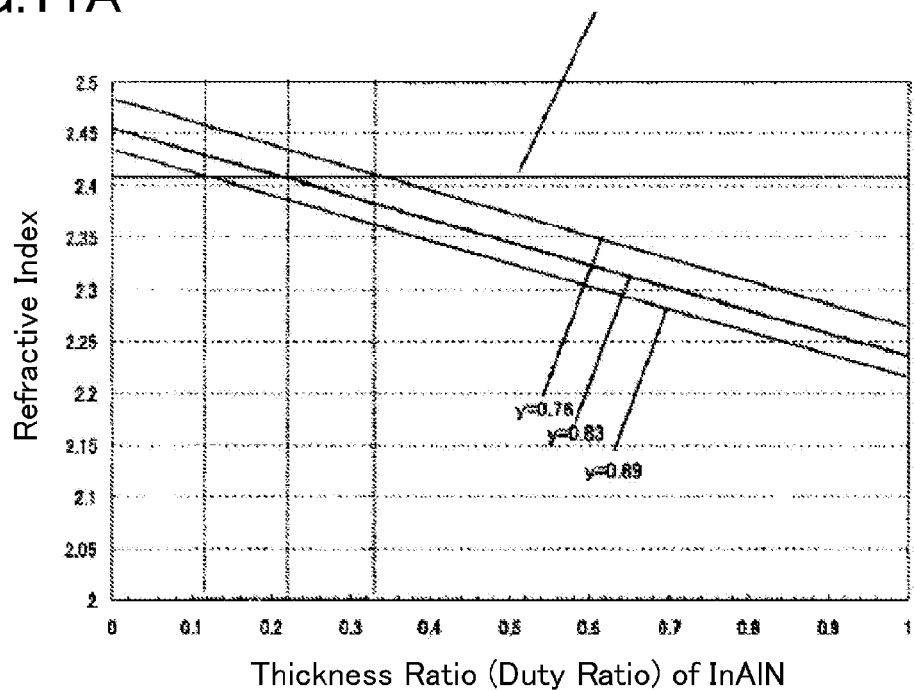
Thickness Ratio (Duty Ratio) of InAlN
FIG.11B  Refractive Index of Al₀.₁Ga₀.₉N at Wavelength of 530 nm
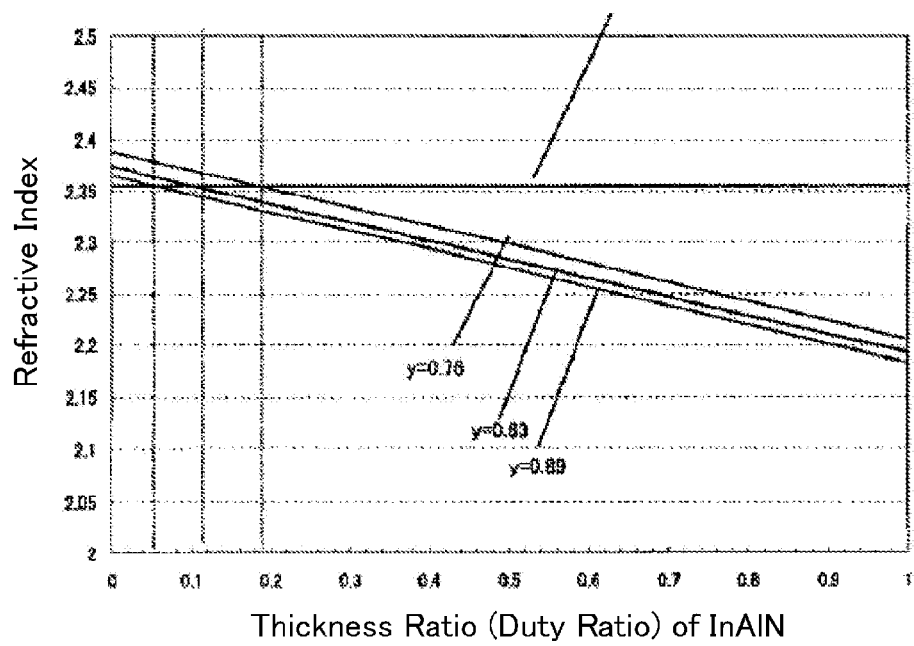
Thickness Ratio (Duty Ratio) of InAlN Refractive Index Distribution in Vertical Direction Light Distribution in Vertical Direction Refractive Index Distribution in Vertical Direction Light Distribution in Vertical Direction

US 9,214,789 B2

SEMICONDUCTOR LIGHT EMITTING ELEMENT

CROSS-REFERENCE TO RELATED APPLICATIONS

This is a continuation of International Application No. PCT/JP2013/002544 filed on Apr. 15, 2013, which claims priority to Japanese Patent Application No. 2012-231383 filed on Oct. 19, 2012. The entire disclosures of these applications are incorporated by reference herein.

BACKGROUND

The present disclosure relates to a semiconductor light emitting element for use as a light source for a projector, for example.

Japanese Unexamined Patent Publication No. 2002-270971 describes a semiconductor light emitting element having a structure in which an active layer is sandwiched between a p-type cladding layer and an n-type cladding layer. Specifically, this semiconductor light emitting element includes a substrate, a first cladding layer of a first conductivity type provided over the substrate, a quantum well active layer provided over the first cladding layer, and a second cladding layer of a second conductivity type provided over the quantum well active layer.

SUMMARY

With such a conventional semiconductor light emitting element, it is difficult to achieve, at the same time, a reduction of lattice mismatch between the substrate and the first cladding layer and light confinement in a vertical direction to the substrate.

Specifically, in the conventional structure, the first cladding layer suitably has a lower refractive index to enhance the light confinement in the vertical direction. Accordingly, it is favorable that the first cladding layer has a high Al composition ratio, for example. On the other hand, an increased Al composition ratio in the first cladding layer results in an increased lattice mismatch between the first cladding layer and the substrate. Thus, it is difficult to achieve, at the same time, the light confinement in the vertical direction and the reduction of lattice mismatch between the substrate and the first cladding layer by increasing the Al composition ratio in the first cladding layer.

It is therefore an object of the present disclosure to achieve, at the same time, a reduction of lattice mismatch between a substrate and a first cladding layer and light confinement in a vertical direction.

A semiconductor light emitting element according to an aspect of the present disclosure includes a first refractive index correction layer of a first conductivity type which is provided between a substrate and a first cladding layer and which includes a layer of $In_{1-x-y}Al_yGa_xN$, where x and y satisfy the relations $x/1.05+y/0.69>1$, $x/0.91+y/0.75\geq1$, and $x/1.08+y/0.91\leq1$, and the element has an emission wavelength of equal to or greater than 430 nm.

BRIEF DESCRIPTION OF THE DRAWINGS

FIG. 11A shows the dependence of the refractive indices of InAlN in a semiconductor light emitting element operating on the 430 nm wavelength band on a thickness constituent ratio. FIG. 11B shows the dependence of the refractive indices of InAlN in a semiconductor light emitting element operating on the 530 nm wavelength band on a thickness constituent ratio.

DETAILED DESCRIPTION

Figure 1:
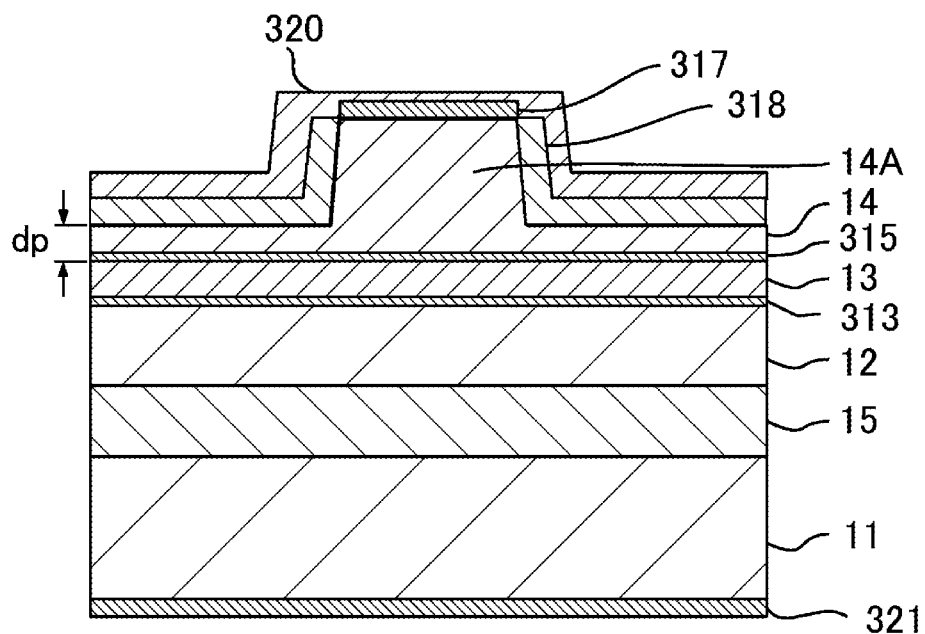
FIG. 1 is a cross-sectional view of a semiconductor light emitting element according to an embodiment of the present disclosure.

In the present disclosure, an expression such as "A is provided 'over' B" refers herein to not only a situation where A is provided over B with at least one component interposed therebetween but also a situation where A is provided in contact with B.

In the present disclosure, a first conductivity type and a second conductivity type are different from each other. If the first conductivity type is n-type, then the second conductivity type is p-type. If the first conductivity type is p-type, then the second conductivity type is n-type.

In the present disclosure, an alloy compound of indium nitride (InN), aluminum nitride (AlN), and gallium nitride (GaN) will be identified herein by $In_aAl_bGa_cN$. If the composition ratios of the group III elements are not specified, the subscripts may be omitted.

A semiconductor light emitting element according to a first example of the present disclosure includes: a substrate including GaN; a first cladding layer of a first conductivity type provided over the substrate and including $In_{1-n1-n2}Al_{n2}Ga_{n1}N$ (where 0<n1<1, 0≤n2<1, and n1+n2≤1); a quantum well active layer provided over the first cladding layer; a second cladding layer of a second conductivity type provided over the quantum well active layer and including $In_{1-m1-m2}Al_{m2}Ga_{m1}N$ (where 0<m1<1, 0<m2<1, and m1+m2≤1); and a first refractive index correction layer of the first conductivity type provided between the substrate and the first cladding layer, wherein the first refractive index correction layer includes a layer of $In_{1-x-y}Al_yGa_xN$ (where x+y<1), x and y satisfy the relations x/1.05+y/0.69>1, x/0.91+y/0.75≥1, and x/1.08+y/0.91≤1, and the quantum well active layer has an emission wavelength of equal to or greater than 430 nm.

A semiconductor light emitting element according to a second example of the present disclosure includes: a substrate including GaN; a first cladding layer of a first conductivity type provided over the substrate and including $In_{1-n1-n2}Al_{n2}Ga_{n1}N$ (where 0<n1<1, 0≤n2<1, and n1+n2≤1); a quantum well active layer provided over the first cladding layer; a second cladding layer of a second conductivity type provided over the quantum well active layer and including $In_{1-m1-m2}Al_{m2}Ga_{m1}N$ (where 0<m1<1, 0<m2<1, and m1+m2≤1); and a first refractive index correction layer of the first conductivity type provided between the substrate and the first cladding layer, wherein the first refractive index correction layer includes a layer of $In_{1-x-y}Al_yGa_xN$ (where x+y<1), x and y satisfy the relations x/1.13+y/0.49>1, x/0.91+y/0.75≥1, and x/1.08+y/0.91≤1, and the quantum well active layer has an emission wavelength of equal to or greater than 530 nm.

A semiconductor light emitting element according to a third example of the present disclosure includes: a substrate including GaN; a first cladding layer of a first conductivity type provided over the substrate and including $In_{1-n1-n2}Al_{n2}Ga_{n1}N$ (where 0<n1<1, 0≤n2<1, and n1+n2≤1); a quantum well active layer provided over the first cladding layer; a second cladding layer of a second conductivity type provided over the quantum well active layer and including $In_{1-m1-m2}Al_{m2}Ga_{m1}N$ (where 0<m1<1, 0<m2<1, and m1+m2≤1); and a first refractive index correction layer of the first conductivity type provided between the substrate and the first cladding layer, wherein the first refractive index correction layer includes a layer of $In_{1-x-y}Al_yGa_xN$ (where x+y<1), x and y satisfy the relations x/1.54+y/0.24>1, x/0.91+y/0.75≥1, and x/1.08+y/0.91≤1, and the quantum well active layer has an emission wavelength of equal to or greater than 630 nm.

The semiconductor light emitting element according to each of these examples may be configured such that x and y satisfy the relations x/0.96+y/0.81≥1 and x/1.04+y/0.87≤1; or the relations x/0.99+y/0.82≥1 and x/1.01+y/0.84≤1; or the relation x/0.80+y/0.89≥1.

The first refractive index correction layer of the semiconductor light emitting element according to each of the examples described above may be a superlattice layer including an $In_{1-x-y}Al_yGa_xN$ layer and a GaN layer.

The semiconductor light emitting element according to each of the examples described above may be configured such that x is 0.

The semiconductor light emitting element according to each of the examples described above may further include a third cladding layer between the first refractive index correction layer and the first cladding layer.

In that case, the first cladding layer may include GaN, and the third cladding layer may include AlGaN.

The semiconductor light emitting element according to each of the examples described above may further include a second refractive index correction layer provided over the second cladding layer.

The semiconductor light emitting element according to each of the examples described above may further include a second refractive index correction layer provided over the quantum well active layer. The second cladding layer may include an upper layer and a lower layer, and the second refractive index correction layer may be arranged between the upper layer and the lower layer.

The semiconductor light emitting element according to each of the examples described above may further include a second refractive index correction layer provided between the quantum well active layer and the second cladding layer.

Embodiment

A semiconductor light emitting element according to an embodiment of the present disclosure will be described with reference to the drawings. As illustrated in FIG. 1, the semiconductor light emitting element of this embodiment includes a substrate 11 of GaN, a first cladding layer 12 of a first conductivity type provided over the substrate 11, a quantum well active layer 13 provided over the first cladding layer 12, and a second cladding layer 14 of a second conductivity type provided over the quantum well active layer 13.

The first cladding layer 12 includes $In_{1-n1-n2}Al_{n2}Ga_{n1}N$ (where 0≤n1<1, 0<n2<1, and n1+n2≤1). The second cladding layer 14 includes $In_{1-m1-m2}Al_{m1}Ga_{m2}N$ (where 0<m1<1, 0<m2<1, and m1+m2≤1).

A refractive index correction layer 15 of the first conductivity type is provided between the substrate 11 and the first cladding layer 12. A guide layer 313 is provided between the first cladding layer 12 and the quantum well active layer 13. A quantum well electron barrier layer 315 of the second conductivity type is provided between the quantum well active layer 13 and the second cladding layer 14. The second cladding layer 14 has a ridge 14A, on which a contact layer 317 of the second conductivity type is provided. A current blocking layer 318 which is transparent with respect to a distribution of light covers the entire second cladding layer 14 but over the ridge 14A. A first electrode 321 is provided over the lower surface of the substrate 11. A second electrode 320 is provided over the contact layer 317 and the current blocking layer 318.

The refractive index correction layer 15 includes a layer of $In_{1-x-y}Al_yGa_xN$ (where x+y<1) of the first conductive type. If the emission wavelength is equal to or greater than 430 nm, the layer of $In_{1-x-y}Al_yGa_xN$ (hereinafter referred to also as an "$In_{1-x-y}Al_yGa_xN$ layer") is configured such that its Ga composition ratio x and Al composition ratio y satisfy the following Expression (1):

$$x/1.05+y/0.69>1 \qquad \text{Expression (1)}$$

If the refractive index correction layer 15 includes an $In_{1-x-y}Al_yGa_xN$ layer satisfying this Expression (1), the layer 15 has a lower refractive index than the first cladding layer 12. The reason is as follows:

First, if the first cladding layer 12 is made of $Al_{n2}Ga_{n1}N$, for the purpose of enhancing the confinement of light in the vertical direction within the quantum well active layer 13, it is recommended that the Al composition ratio n2 be increased in order to reduce the refractive index of the first cladding layer 12. However, if the Al composition ratio n2 is increased to 0.1 or more, for example, the difference in thermal expansion coefficient between the substrate 11 of GaN and the first cladding layer 12 of $Al_{n2}Ga_{n1}N$ will increase so much that cracks will be easily caused in the structure of the light emitting element due to the thermal hysteresis during the crystal growth. In addition, lattice defects will also be caused easily in the structure. Therefore, in order to avoid causing cracks, the maximum value of the Al composition ratio n2 in the first cladding layer 12 is set to be 0.1. When the Al composition ratio n2 is 0.1, i.e., the maximum value, the refractive index of the first cladding layer 12 is substantially at its lower limit.

Therefore, the refractive index of the refractive index correction layer 15 just needs to be lower than the substantial lower limit of the refractive index of the first cladding layer 12.

Figure 2:
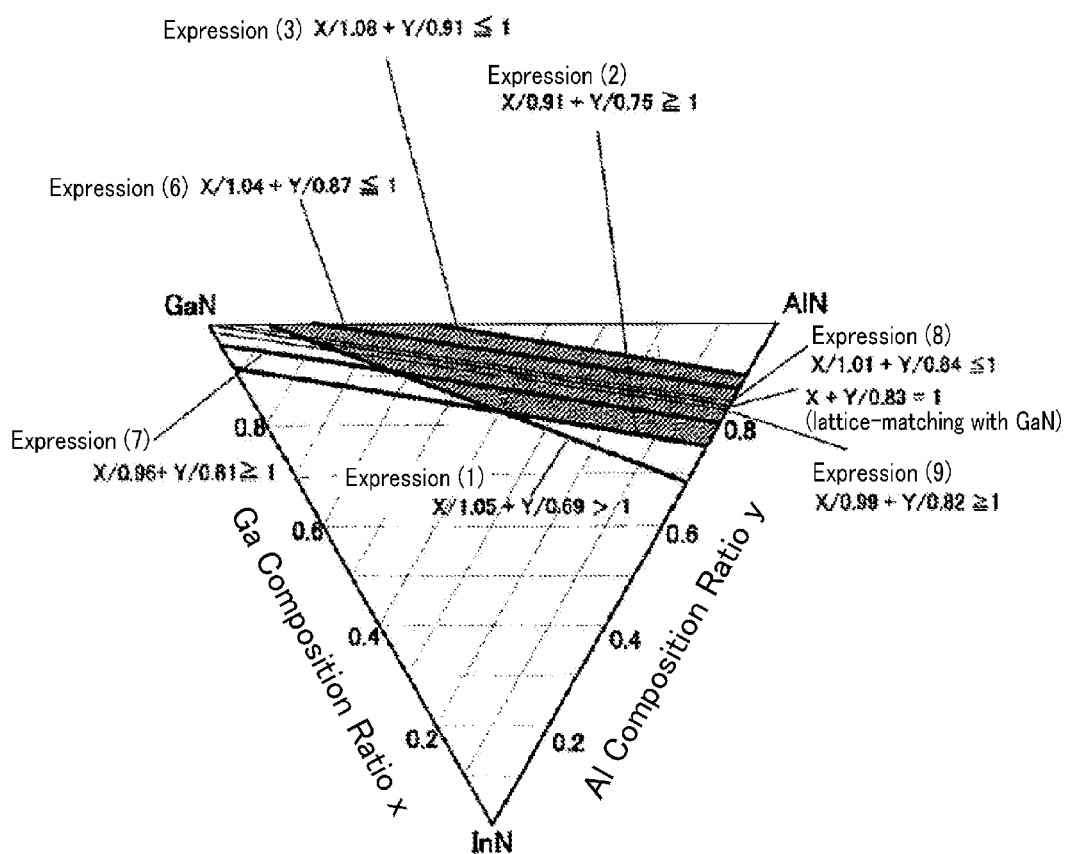
FIG. 2 illustrates a composition ratio setting region of a material for a first refractive index correction layer of the semiconductor light emitting element according to the embodiment.

If the emission wavelength is 430 nm, an $In_{1-x-y}Al_yGa_xN$ layer of which the refractive index is equal to that of a layer of $Al_{0.1}Ga_{0.9}N$ having an Al composition ratio n2 of 0.1 corresponds, in FIG. 2, to the line segment represented by x/1.05+y/0.69=1. That is to say, a layer of which the composition ratios are located on the line segment that connects $In_{0.31}Al_{0.69}N$ (of which the In, Al, and Ga composition ratios are 0.31, 0.69, and 0, respectively) and $Al_{0.1}Ga_{0.9}N$ (of which the Al, Ga, and In composition ratios are 0.1, 0.9, and 0, respectively) together has a refractive index that is equal to the substantial lower limit refractive index of the first cladding layer 12.

Therefore, a layer of which the composition ratios are located over the line segment, i.e., located closer to MN, has a refractive index that is lower than the substantial lower limit refractive index of the first cladding layer 12. Thus, if the refractive index correction layer 15 includes an $In_{1-x-y}Al_yGa_xN$ layer having composition ratios satisfying Expression (1), the layer 15 has a lower refractive index than the first cladding layer 12.

Thus, if the emission wavelength is equal to or greater than 430 nm, an $In_{1-x-y}Al_yGa_xN$ (where x/1.05+y/0.69>1 and x+y<1) layer arranged under the first cladding layer 12 serves as a refractive index correction layer 15 having a lower refractive index than the first cladding layer 12. With this configuration, the difference between the effective refractive index of the quantum well active layer 13 and the refractive index of the first cladding layer 12 can be increased, and accordingly, the light confinement can be enhanced in the vertical direction.

In this embodiment, the $In_{1-x-y}Al_yGa_xN$ layer forming the refractive index correction layer 15 further satisfies the following Expressions (2) and (3):

$$x/0.91+y/0.75 \geq 1 \qquad \text{Expression (2)}$$

$$x/1.08+y/0.91 \leq 1 \qquad \text{Expression (3)}$$

With such a configuration in which the $In_{1-x-y}Al_yGa_xN$ layer forming the refractive index correction layer 15 satisfies these Expressions (2) and (3), the differences in lattice constant can be reduced to 1% or less between the refractive index correction layer 15 and the substrate 11 and between the layer 15 and the first cladding layer 12. Thus, the lattice mismatch between the substrate 11 and the first cladding layer 12 can be reduced.

Therefore, if the refractive index correction layer 15 is formed out of an $In_{1-x-y}Al_yGa_xN$ layer that satisfies all of Expressions (1), (2), and (3), reduction in lattice match between the substrate 11 and the first cladding layer 12 and enhancement of the light confinement in the vertical direction can be achieved at the same time.

Note that if the emission wavelength is set to be equal to or greater than 530 nm, the condition set by Expression (1) can be eased to the range represented by the following Expression (4):

$$x/1.13+y/0.49>1 \qquad \text{Expression (4)}$$

If the emission wavelength is equal to or greater than 530 nm, the refractive index correction layer 15 including an $In_{1-x-y}Al_yGa_xN$ layer which satisfies Expression (4) has a lower refractive index than the first cladding layer 12. If the emission wavelength is 530 nm, an $In_{1-x-y}Al_yGa_xN$ layer, of which the refractive index is equal to that of an $Al_{0.1}Ga_{0.9}N$ layer having an Al composition ratio of 0.1 at which the first cladding layer 12 has the lower limit refractive index, corresponds to the line segment represented by x/1.13+y/0.49=1 in FIG. 3. That is to say, if the emission wavelength is equal to or greater than 530 nm, a layer of which the composition ratios are located on the line segment that connects together $In_{0.51}Al_{0.49}N$ (of which the In, Al, and Ga composition ratios are 0.51, 0.49, and 0, respectively), and $Al_{0.1}Ga_{0.9}N$ (of which the Al, Ga, and In composition ratios are 0.1, 0.9, and 0, respectively) has a refractive index that is equal to the substantial lower limit refractive index of the first cladding layer 12.

Therefore, a layer of which the composition ratios are located over this line segment, i.e., located closer to MN, has a refractive index that is lower than the substantial lower limit refractive index of the first cladding layer 12. Thus, the refractive index correction layer 15 including an $In_{1-x-y}Al_yGa_xN$ layer having composition ratios that satisfy Expression (4) can have a lower refractive index than the first cladding layer 12.

Thus, if the emission wavelength is equal to or greater than 530 nm, an $In_{1-x-y}Al_yGa_xN$ (where x/1.13+y/0.49>1 and x+y<1) layer arranged under the first cladding layer 12 can serve as a refractive index correction layer 15 having a lower refractive index than the first cladding layer 12. With this configuration, the difference between the effective refractive index of the quantum well active layer 13 and the refractive index of the first cladding layer 12 can be increased, and accordingly, the light confinement can be enhanced in the vertical direction.

Also, even if the emission wavelength is equal to or greater than 530 nm, as long as the $In_{1-x-y}Al_yGa_xN$ layer forming the refractive index correction layer 15 satisfies Expressions (2) and (3), the difference in lattice constant can be reduced to 1% or less between the refractive index correction layer 15 and the substrate 11 and between the layer 15 and the first cladding layer 12. Thus, the lattice mismatch between the substrate 11 and the first cladding layer 12 can be reduced.

Note that if the emission wavelength is set to be equal to or greater than 630 nm, the condition set by Expression (1) can be eased to the range represented by the following Expression (5):

$$x/1.54+y/0.24>1 \qquad \text{Expression (5)}$$

If the emission wavelength is equal to or greater than 630 nm, the refractive index correction layer 15 including an $In_{1-x-y}Al_yGa_xN$ layer which satisfies Expression (5) has a lower refractive index than the first cladding layer 12. If the emission wavelength is 630 nm, an $In_{1-x-y}Al_yGa_xN$ layer, of which the refractive index is equal to that of an $Al_{0.1}Ga_{0.9}N$ layer having an Al composition ratio of 0.1 at which the first cladding layer 12 has the lower limit refractive index corresponds to the line segment represented by x/1.54+y/0.24=1 in FIG. 4. That is to say, if the emission wavelength is equal to or greater than 630 nm, a layer of which the composition ratios are located on the line segment that connects together $In_{0.76}Al_{0.24}N$ (of which the In, Al, and Ga composition ratios are 0.76, 0.24, and 0, respectively), and $Al_{0.1}Ga_{0.9}N$ (of which the Al, Ga, and In composition ratios are 0.1, 0.9, and 0, respectively) has a refractive index that is equal to the substantial lower limit refractive index of the first cladding layer 12.

Therefore, a layer of which the composition ratios are located over this line segment, i.e., located closer to AlN, has a refractive index that is lower than the substantial lower limit refractive index of the first cladding layer 12. Thus, the refractive index correction layer 15 including an $In_{1-x-y}Al_yGa_xN$ layer satisfying Expression (5) can have a lower refractive index than the first cladding layer 12.

Thus, if the emission wavelength is equal to or greater than 630 nm, an $In_{1-x-y}Al_yGa_xN$ (where x/1.13+y/0.49>1 and x+y≤1) layer arranged under the first cladding layer 12 can serve as a refractive index correction layer 15 having a lower refractive index than the first cladding layer 12. With this configuration, the difference between the effective refractive index of the quantum well active layer 13 and the refractive index of the first cladding layer 12 can be increased, and accordingly, the light confinement can be enhanced in the vertical direction.

Also, even if the emission wavelength is equal to or greater than 630 nm, as long as the $In_{1-x-y}Al_yGa_xN$ layer forming the refractive index correction layer 15 satisfies Expressions (2) and (3), the difference in lattice constant can be reduced to 1% or less between the refractive index correction layer 15 and the substrate 11 and between the layer 15 and the first cladding layer 12. Thus, the lattice mismatch between the substrate 11 and the first cladding layer 12 can be reduced.

Further, the $In_{1-x-y}Al_yGa_xN$ layer forming the refractive index correction layer 15 may satisfy the following Expressions (6) and (7), in addition to Expression (1), (4), or (5). With this configuration, the design flexibility of the refractive index correction layer 15 can be increased. The reason is as follows:

$$x/1.04+y/0.87 \leq 1 \qquad \text{Expression (6)}$$

$$x/0.96+y/0.81 \geq 1 \qquad \text{Expression (7)}$$

Figure 5A:
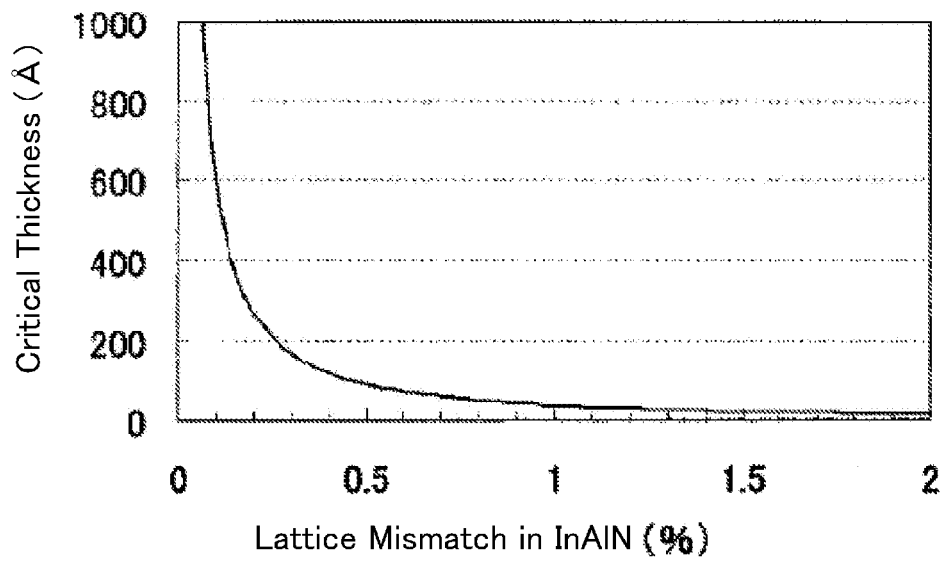
FIG. 5A shows a relation between lattice mismatch and a critical thickness in the semiconductor light emitting element according to the embodiment.
Figure 5B:
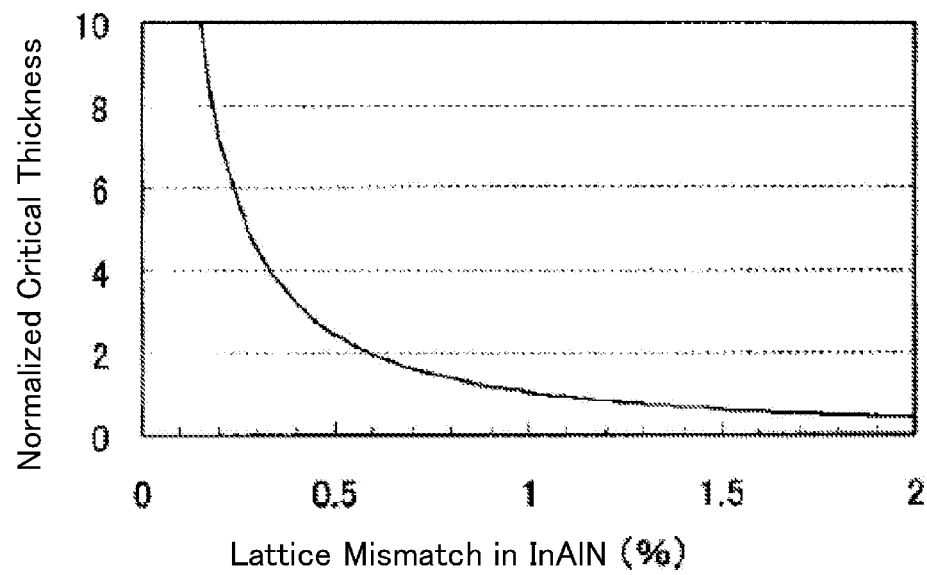
FIG. 5B shows a relation between lattice mismatch and a normalized critical thickness in the semiconductor light emitting element according to the embodiment.

FIG. 5A shows a relation between a critical thickness at which lattice defects are caused and the lattice mismatch in InAlN. FIG. 5B shows a relation between a normalized critical thickness and the lattice mismatch. In FIG. 5B, the critical thickness is normalized with a value at which the lattice mismatch is 1%. As shown in FIG. 5A, if the difference in lattice constant between the substrate 11 of GaN and the refractive index correction layer 15 is 0.45% or less, the occurrence of lattice defects can be suppressed within a thickness range of 100 Å or less.

It is thus possible to increase the design flexibility of the refractive index correction layer 15 by reducing the difference in lattice constant to 0.45% or less. The atomic composition ratio range given by these Expressions (6) and (7) corresponds to the atomic composition ratio range in which the difference in lattice constant between the substrate 11 of GaN and the refractive index correction layer 15 is 0.45% or less. Therefore, if an $In_{1-x-y}Al_yGa_xN$ layer satisfying both of these Expressions (6) and (7) is used as the refractive index correction layer 15, the difference in lattice constant between the substrate 11 and the refractive index correction layer 15 can be reduced to 0.45% or less. As a result, the design flexibility of the refractive index correction layer 15 can be increased. In particular, in this case, if the refractive index correction layer 15 is a superlattice layer comprised of an $In_{1-x-y}Al_yGa_xN$ layer having a thickness of 100 Å or less and a GaN layer, since the tunneling effect that is a quantum effect will contribute to improvement of its electrical conduction characteristic, the series resistance of the element can be reduced.

Figure 3:
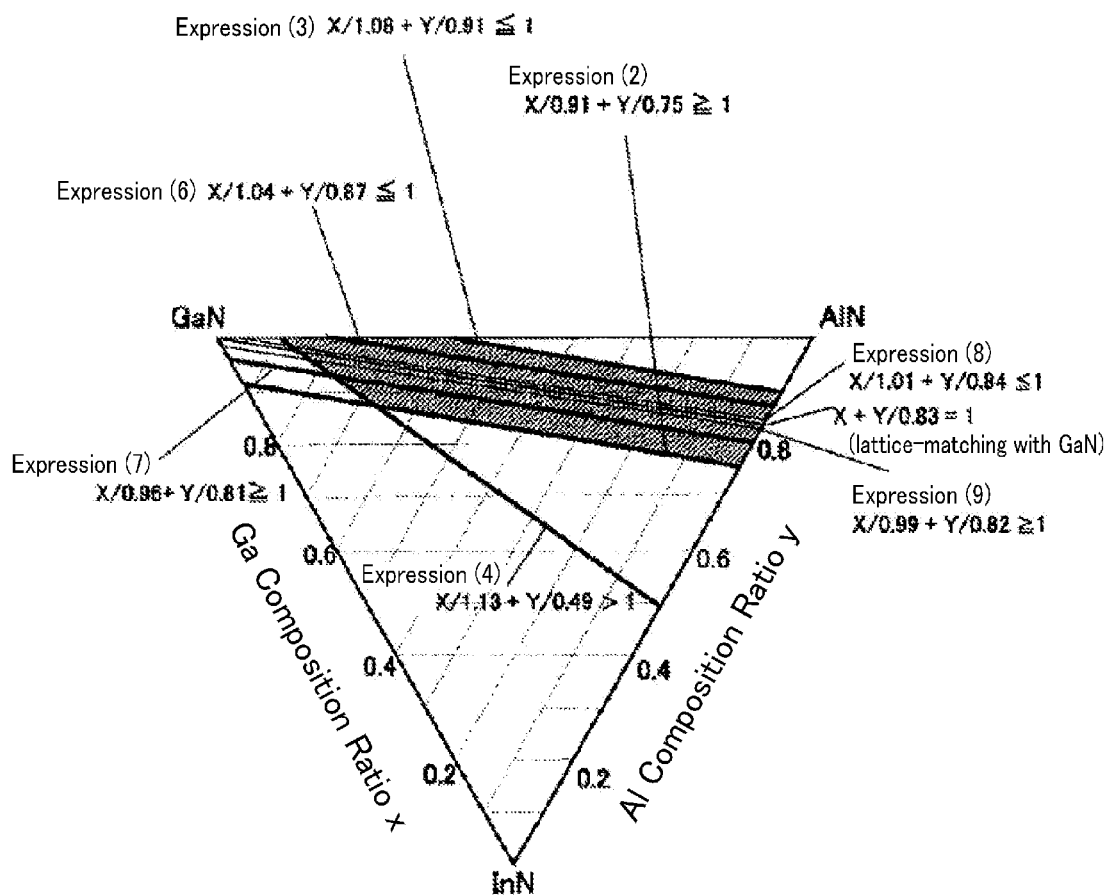
FIG. 3 illustrates a composition ratio setting region of another material for the first refractive index correction layer of the semiconductor light emitting element according to the embodiment.
Figure 4:
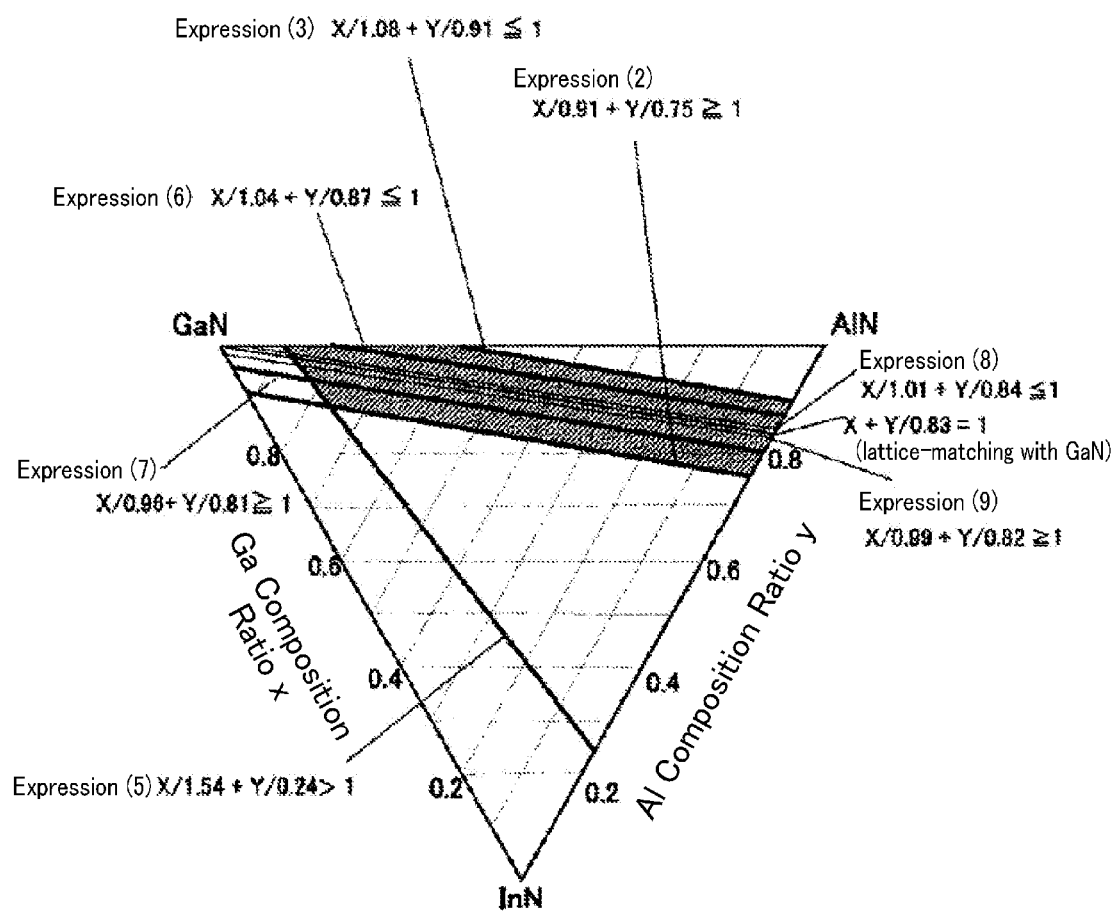
FIG. 4 illustrates a composition ratio setting region of another material for the first refractive index correction layer of the semiconductor light emitting element according to the embodiment.

Therefore, if the $In_{1-x-y}Al_yGa_xN$ layer forming the refractive index correction layer 15 satisfies Expression (1), (4), or (5) as well as Expressions (6) and (7), it is possible to increase the design flexibility of the refractive index correction layer 15 while making the refractive index correction layer 15 have a lower refractive index than the first cladding layer 12. As illustrated in FIG. 2, the range in which Expressions (1), (6) and (7) are satisfied is included in the range in which Expressions (1), (2), and (3) are satisfied. As illustrated in FIG. 3, the range in which Expressions (4), (6), and (7) are satisfied is included in the range in which Expressions (4), (2), and (3) are satisfied. As illustrated in FIG. 4, the range in which Expressions (5), (6), and (7) are satisfied is included in the range in which Expressions (5), (2), and (3) are satisfied.

The $In_{1-x-y}Al_yGa_xN$ layer forming the refractive index correction layer 15 may satisfy the following Expressions (8) and (9) as well as Expression (1), (4), or (5). With this configuration, the design flexibility of the refractive index correction layer 15 can be further increased. The reason is as follows:

$$x/1.01+y/0.84 \leq 1 \qquad \text{Expression (8)}$$

$$x/0.99+y/0.82 \geq 1 \qquad \text{Expression (9)}$$

As shown in FIGS. 5A and 5B, if the difference in lattice constant between the substrate 11 of GaN and the refractive index correction layer 15 is 0.1% or less, the critical thickness at which lattice defects are caused sharply increases.

Accordingly, it is possible to increase the design flexibility of the refractive index correction layer 15 by reducing the difference in lattice constant to 0.1% or less. The atomic composition ratio range given by these Expressions (8) and (9) correspond to the atomic composition ratio range in which the difference in lattice constant between the substrate 11 of GaN and the refractive index correction layer 15 is 0.1% or less. Therefore, if an $In_{1-x-y}Al_yGa_xN$ layer satisfying both of these Expressions (8) and (9) is used as the refractive index correction layer 15, the difference in lattice constant between the substrate 11 and the refractive index correction layer 15 can be reduced to 0.1% or less. As a result, the design flexibility of the refractive index correction layer 15 can be increased. In particular, in this case, even when the refractive index correction layer 15 has a thickness of 1,000 Å or more, the occurrence of lattice defects can be suppressed.

Therefore, if the $In_{1-x-y}Al_yGa_xN$ layer forming the refractive index correction layer 15 satisfies Expression (1), (4), or (5) as well as Expressions (8) and (9), it is possible to increase the design flexibility of the refractive index correction layer 15 while making the refractive index correction layer 15 have a lower refractive index than the first cladding layer 12. As illustrated in FIG. 2, the range in which Expressions (1), (8) and (9) are satisfied is included in the range in which Expressions (1), (2), and (3) are satisfied. As illustrated in FIG. 3, the range in which Expressions (4), (8), and (9) are satisfied is included in the range in which Expressions (4), (2) and (3) are satisfied. As illustrated in FIG. 4, the range in which Expressions (5), (8), and (9) are satisfied is included in the range in which Expressions (5), (2), and (3) are satisfied.

Figure 6:
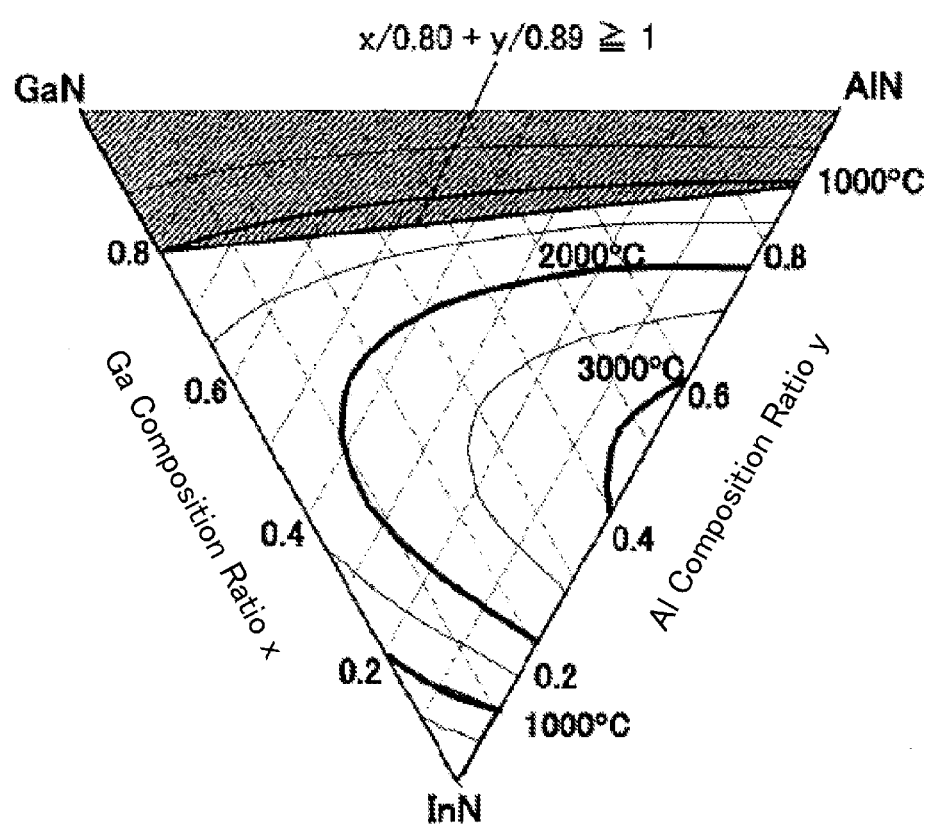
FIG. 6 illustrates results of a thermodynamic analysis of a region of compositional separation in an InGaAlN material in a bulk state.

Further, as illustrated in FIG. 6, x and y suitably satisfy the following Expression (10) to reduce compositional separation:

$$x/0.80 + y/0.89 \geq 1 \qquad \text{Expression (10)}$$

FIG. 6 relates to InAlGaN in a bulk state and illustrates atomic composition ratio ranges of InAlGaN in a bulk state in which compositional separation occurs at various crystal growth temperatures obtained by thermodynamic calculation. As can be seen from FIG. 6, the atomic composition ratio range in which compositional separation occurs expands as the crystal growth temperature is lowered.

As long as the $In_{1-x-y}Al_yGa_xN$ layer forming the refractive index correction layer 15 satisfies this Expression (10), even if the $In_{1-x-y}Al_yGa_xN$ layer is formed by performing a crystal growing process at a temperature of 1000° C. or less, a uniform distribution of atomic composition ratios can be easily obtained in that $In_{1-x-y}Al_yGa_xN$ layer.

Moreover, the refractive index correction layer 15 may be comprised of $In_{1-x-y}Al_yGa_xN$ alone, but may also be a superlattice layer having a multiple quantum well structure including an $In_{1-x-y}Al_yGa_xN$ layer and a GaN layer. In the latter case, the temperature characteristics of the light emitting element can be improved. The reason is as follows:

Firstly, if a superlattice layer of multiple quantum well structure including an $In_{1-x-y}Al_yGa_xN$ layer and a GaN layer is provided as the refractive index correction layer 15, the $In_{1-x-y}Al_yGa_xN$ layer which lattice-matches with the substrate 11 of GaN is sandwiched between the substrate 11 of GaN and the GaN layer included in the refractive index correction layer 15. The $In_{1-x-y}Al_yGa_xN$ layer consequently has the top and bottom interfaces that are in contact with GaN. Accordingly, strain energy generated due to the lattice mismatch at the interfaces increases, which allows compositional separation to hardly occur thermodynamically. Even if compositional separation occurs slightly, the GaN layer growing over the $In_{1-x-y}Al_yGa_xN$ layer makes it easy to recover a sufficient degree of crystallinity. Thus, the occurrence of lattice defects or light absorption centers can be suppressed in the entire refractive index correction layer 15, thereby realizing a uniform in-plane distribution of composition ratios.

As a result, a semiconductor light emitting element having a small operating current value, high slope efficiency, and improved temperature characteristics is provided.

Moreover, if the refractive index correction layer 15 includes, instead of the $In_{1-x-y}Al_yGa_xN$ layer, an InAlN (i.e. x=0) layer, the composition ratios can be controlled easily during the crystal growing process, thereby enabling more accurate control of a light distribution in the vertical direction. As a result, the yield of the semiconductor light emitting element can be increased, and the manufacturing costs of the semiconductor light emitting element can be reduced.

EXAMPLES

More specific examples of the present disclosure will be described below. Note that the examples described below are intended for purposes of illustration only, and are not intended to limit the scope, applications, and use of the disclosure.

First Example

A semiconductor light emitting element according to a first example has a cross-sectional structure as illustrated in FIG. 1.

The semiconductor light emitting element of the first example includes a substrate 11 of GaN, and an n-type refractive index correction layer 15 (having a thickness of 0.5 μm and) including an $In_{1-x-y}Al_yGa_xN$ layer is provided over the upper surface of the substrate 11 of GaN. A first cladding layer 12 of n-type (having a thickness of 1.0 μm and) including AlGaN is provided over the upper surface of the refractive index correction layer 15. A guide layer 313 (having a thickness of 860 Å and) including AlGaN is provided over the upper surface of the first cladding layer 12. The guide layer 313 may include an n-type or undoped GaN layer. A multiple quantum well active layer 13 including InGaN is provided over the upper surface of the guide layer 313. A p-type quantum well electron barrier layer 315 is provided over the upper surface of the multiple quantum well active layer 13. A second cladding layer 14 of p-type including AlGaN is provided over the upper surface of the quantum well electron barrier layer 315. The second cladding layer 14 has a ridge 14A. A p-type contact layer 317 (having a thickness of 0.1 μm and) including GaN is provided over the upper surface of the ridge 14A. A current blocking layer 318 which is transparent with respect to a distribution of light is provided over the entire upper surface of the second cladding layer 14 but the ridge 14A and on the side surface of the ridge 14A. A second electrode 320 serving as a p-side electrode is provided over the respective upper surfaces of the contact layer 317 and current blocking layer 318. A first electrode 321 serving as an n-side electrode is provided over the lower surface of the substrate 11. The ridge 14A of the second cladding layer 14 has a width (W) of 8.0 μm.

The second cladding layer 14 is configured such that the distance from the upper surface of the ridge 14A to the quantum well active layer 13 is 0.5 μm, and that the distance from the lower end of the ridge 14A to the quantum well active layer 13 is 0.1 μm.

In the first example, in order to confine light in the vertical direction within the quantum well active layer 13, each of the first cladding layer 12 of n-type and the second cladding layer 14 of p-type includes $Al_{0.05}Ga_{0.95}N$. If an Al composition ratio of each of the first and second cladding layers 12 and 14 is increased, the difference in refractive index can be widened between the quantum well active layer 13 and the first cladding layer 12 and between the quantum well active layer 13 and the second cladding layer 14. Thus, confinement of light can be enhanced in the vertical direction within the quantum well active layer 13, and a lasing threshold current can be reduced.

In the first example, in order to obtain laser oscillation at a wavelength of 430 nm, the quantum well active layer 13 has a double quantum well (DQW) structure including two well layers each having a thickness of 30 Å and including $In_{0.15}Ga_{0.85}N$ having an In composition ratio of 0.15.

The lattice mismatch between the $In_{0.15}Ga_{0.85}N$ layer and the GaN layer is 1.6%. That is why if each well layer had a thickness greater than 30 Å, the thickness is much greater than the critical thickness, which would cause lattice defects. The lattice defects would serve as centers of light absorption and cause an increase in the lasing threshold current and/or operating current value of the element. For that reason, to avoid a decrease in reliability, it is important to suppress the occurrence of those lattice defects as much as possible. Therefore, in order to reduce the lattice defects, each well layer suitably has a thickness of 30 Å or less.

Even if each wall layer has a small thickness of 30 Å or less, it is also recommended that the quantum well active layer 13 have the DQW structure including two well layers, or a triple quantum well (TQW) structure including three well layers. With this configuration, it is possible to prevent a light confinement coefficient from decreasing. With three or less well layers, it is also possible to reduce a variation in operating carrier density between those well layers and a variation in gain peak wavelength which provides the maximum gain between those well layers. In addition, it is also possible to reduce an increase in lasing threshold current and an increase in the series resistance of the element. Moreover, it is possible to reduce influence of an electric potential gradient on the barrier layer due to the piezoelectric effect, and to reduce degradation of the temperature characteristics of the element.

According to the first example, the substrate 11 of GaN and the first cladding layer 12 sandwich, between themselves, the n-type refractive index correction layer 15 (having a thickness of 0.5 μm and) including $In_{1-x-y}Al_yGa_xN$ (where x+y≤1), in which x and y satisfy not only Expression (1) but also one of the three sets of Expressions (2) and (3), Expressions (6) and (7), and Expressions (8) and (9), or Expression (10).

The semiconductor light emitting element of the first example includes, on the side surface of the ridge 14A, the current blocking layer 318 (having a thickness of 0.1 μm and) made of a dielectric including SiN. Therefore, the current injected from the p-type contact layer 317 including GaN is concentrated by the current blocking layer 318 toward only the ridge 14A, and then injected densely into the quantum well active layer 13 located under the bottom of the ridge 14A. Accordingly, a carrier population inversion required for laser oscillation is realized by an injected current of as low as about 100 mA. The light produced by recombination of carriers that have been injected into the quantum well active layer 13 is confined in the direction vertical to the quantum well active layer 13 by the first and second cladding layers 12 and 14, and is also confined in the direction parallel to the quantum well active layer 13 by the current blocking layer 318 that has a lower refractive index than the first and second cladding layers 12 and 14. Since the current blocking layer 318, which is transparent with respect to laser oscillation light, causes no light absorption, a waveguide with low loss can be provided. A distribution of light propagating through the waveguide can significantly spread into the current blocking layer 318, and therefore, a refractive index difference ΔN of the order of $10^{-3}$ which is suitable for high-power operation can be easily obtained. Moreover, the magnitude of the Δn can be accurately controlled by the distance (dp) between the current blocking layer 318 and the quantum well active layer 13 on the order of $10^{-3}$. As a result, a high-power semiconductor laser having a small operating current can be obtained with its distribution of light controlled accurately. In the first example, light was confined laterally with the difference ΔN in refractive index set to be $3.5 \times 10^{-3}$.

The atomic composition ratio of the $In_{1-x-y}Al_yGa_xN$ layer forming the refractive index correction layer 15 will now be described. In an InAlGaN nitride compound semiconductor including InN, AlN, and GaN, the lattice mismatches between InN and GaN, between the InN and AlN, and between GaN and AlN are 11.3%, 13.9%, and 2.3%, respectively. In this case, interatomic distances are different from one another between InN, GaN, and AlN. Accordingly, the atom intervals and atom bond angles between the atoms forming the InAlGaN layer are different from those of a two-dimensional compound semiconductor in an ideal state. Therefore, even if the InAlGaN layer has its atomic composition ratios set so as to have the same lattice constant as GaN, the internal strain energy will be accumulated within the InAlGaN layer.

In InAlGaN, since an action to reduce this internal strain energy will be produced, there is a composition ratio range in which compositional separation occurs. The occurrence of compositional separation causes the In atoms, Ga atoms, and Al atoms to be distributed non-uniformly in the InAlGaN layer. Thus, the In atoms, Ga atoms, and Al atoms will not be distributed uniformly in accordance with the atomic composition ratios within the InAlGaN layer, thus, causing segregation in their distribution. The occurrence of compositional separation also makes non-uniform the distribution of band gap energy and the distribution of refractive indices. A region with non-uniform composition ratio, where the compositional separation has occurred, serves as a center of light absorption, and causes scattering of guided light. Therefore, the occurrence of compositional separation increases the operating current of the semiconductor laser element and decreases the reliability of the semiconductor laser element.

FIG. 6 relates to $In_{1-x-y}Al_yGa_xN$ in a bulk state and illustrates the atomic composition ratio ranges of $In_{1-x-y}Al_yGa_xN$ in a bulk state in which compositional separation occurs at various crystal growth temperatures obtained by thermodynamic calculation. As can be seen from FIG. 6, the atomic composition ratio range in which compositional separation occurs expands as the crystal growth temperature is lowered. When crystals of $In_{1-x-y}Al_yGa_xN$ grow at a temperature of about 1000° C., as indicated by the shaded portion in FIG. 6, a uniform distribution of atomic composition ratio is easily obtained in a range in which a Ga composition ratio x and an Al composition ratio y satisfy the expression x/0.80+y/0.89≥1. Accordingly, if the thickness of an $In_{1-x-y}Al_yGa_xN$ layer is set to be 0.1 μm or more, the atomic composition ratio range is suitably set to be x/0.80+y/0.89≥1 in order to make the layer have a uniform distribution of atomic composition ratio which allows no compositional separation. Also, even if the thickness of the $In_{1-x-y}Al_yGa_xN$ layer is set to be 100 Å or more, the atomic composition ratio range is suitably set to be x/0.80+y/0.89≥1 in order to make the layer have a uniform distribution of atomic composition ratio which allows no compositional separation. If the $In_{1-x-y}Al_yGa_xN$ layer has a thickness of 100 Å or more, the thickness will exceed the critical thickness even if the lattice mismatch with the GaN substrate is as small as about 1%, and a probability of occurrence of lattice defects increases. Once lattice defects have occurred, the lattice constant approaches the value of the original lattice constant of the layer, and the strain energy due to the lattice mismatch with the substrate decreases. Therefore, compositional separation easily occurs in the atomic composition ratio range in the bulk state illustrated in FIG. 6. Note that, in the first example, $In_{1-x-y}Al_yGa_xN$ in a bulk state refers to an $In_{1-x-y}Al_yGa_xN$ layer having a lattice constant determined by the atomic composition ratio of the $In_{1-x-y}Al_yGa_xN$.

Figure 7:
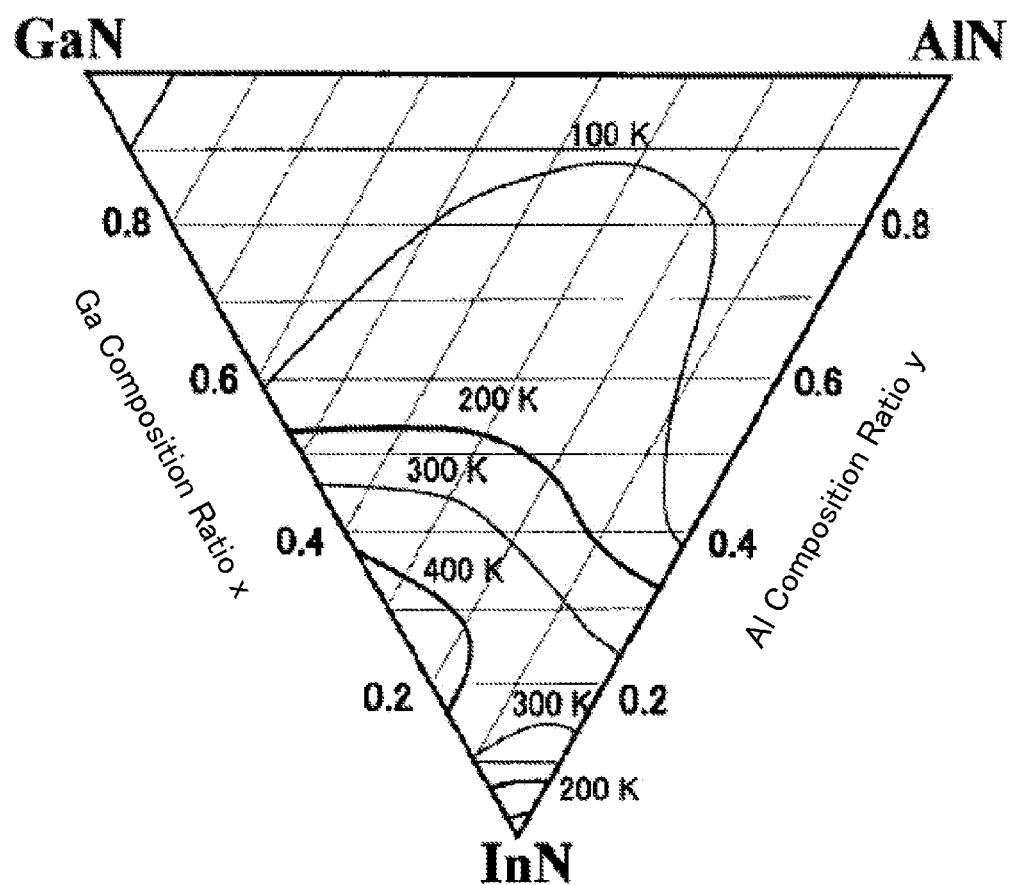
FIG. 7 illustrates results of a thermodynamic analysis of a region of compositional separation in an InGaAlN material which lattice-matches with a GaN layer.

FIG. 7 relates to a case where a refractive index correction layer 15 including an $In_{1-x-y}Al_yGa_xN$ layer is formed on a substrate 11 of GaN such that the former and the latter lattice-match with each other, and illustrates atomic composition ratio ranges where compositional separation occurs at various crystal growth temperatures obtained by thermodynamic calculation. The present inventors discovered that when a refractive index correction layer 15 including an $In_{1-x-y}Al_yGa_xN$ layer was formed on a substrate 11 of GaN by performing a crystal-growing process at a high temperature of about 1000° C., no compositional separation occurred unlike an $In_{1-x-y}Al_yGa_xN$ in a bulk state. The reason is as follows. At a high temperature of about 1000° C., strain energy would have been produced within the $In_{1-x-y}Al_yGa_xN$ layer such that the refractive index correction layer 15 would lattice-match with the substrate 11 of GaN, and consequently, the crystal structures would have become thermodynamically stable in every one of the atom composition ratio ranges.

Figure 8A:
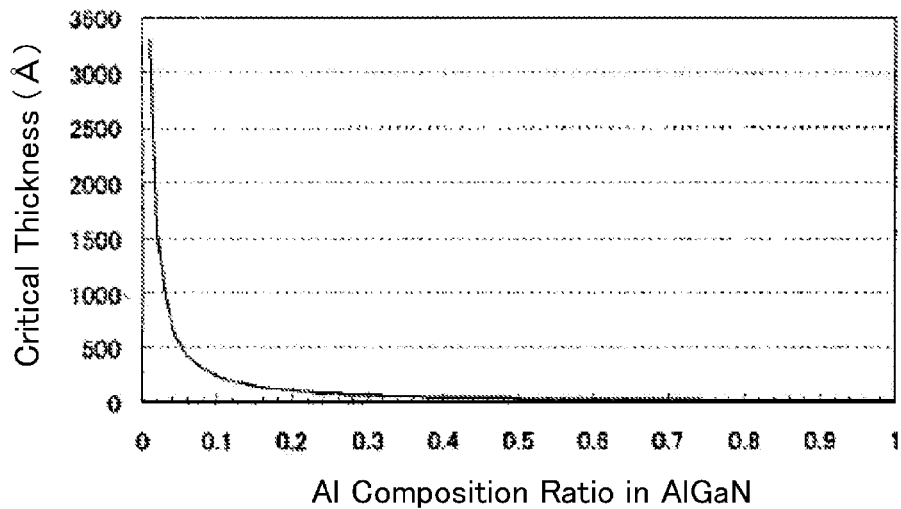
FIG. 8A shows the dependence of a critical thickness of AlGaN on an Al composition ratio.
Figure 8B:
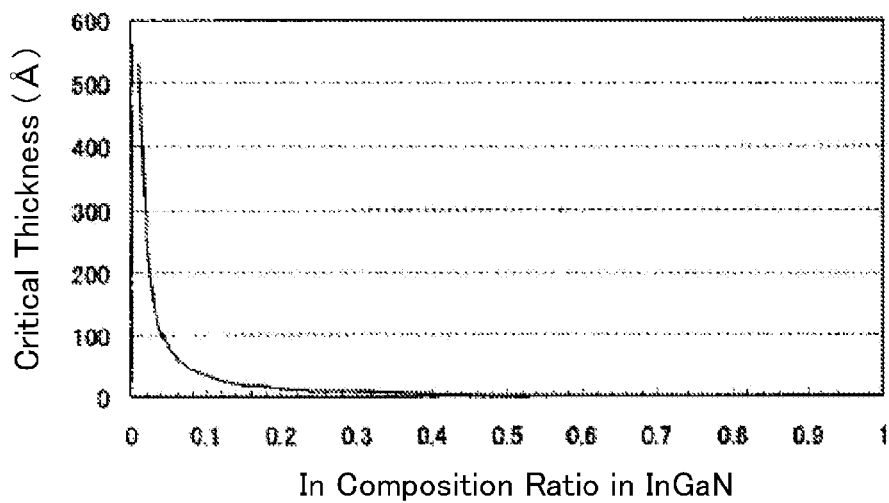
FIG. 8B shows the dependence of a critical thickness of InGaN on an In composition ratio.
Figure 8C:
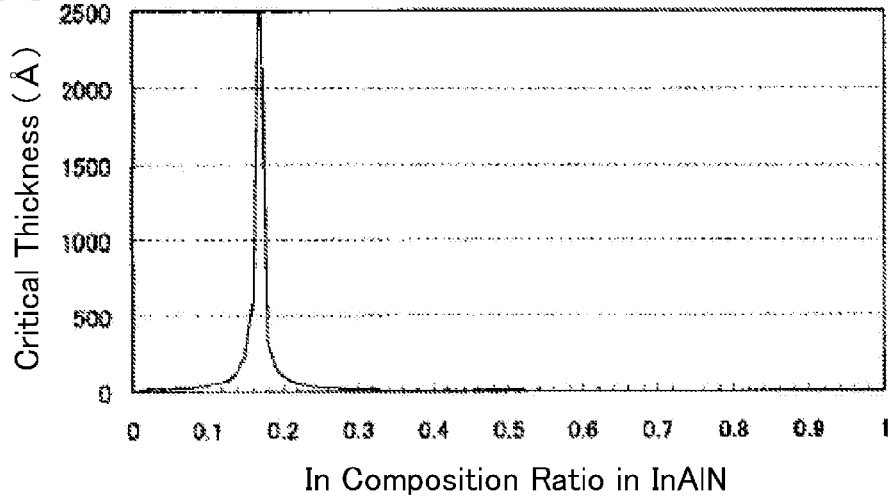
FIG. 8C shows the dependence of a critical thickness of InAlN on an In composition ratio.

However, once the thickness of an $In_{1-x-y}Al_yGa_xN$ layer exceeds the corresponding one of the critical thicknesses illustrated in FIGS. 8A to 8C, the influence of strain energy produced by making the $In_{1-x-y}Al_yGa_xN$ layer lattice-match with the substrate 11 of GaN may cause lattice defects. FIGS. 8A, 8B, and 8C respectively show calculation results indicating composition ratio dependences of the critical thicknesses of an AlGaN layer, an InGaN layer, and an InAlN layer each formed over a substrate 11 of GaN. As shown in FIG. 8A, the AlGaN layer formed over the substrate 11 of GaN has a critical thickness of 230 Å when the Al composition ratio is 0.1, a critical thickness of 530 Å when the Al composition ratio is 0.05, and a critical thickness of 1500 Å when the Al composition ratio is 0.02. Accordingly, when a cladding layer including an AlGaN layer having a thickness of about 1 μm or more is formed over the substrate 11, it is probable that lattice defects have occurred in the cladding layer in many cases. These lattice defects increase the resistance of the AlGaN cladding layer and serve as the centers of light absorption, thus causing an increase in operating current value and lasing threshold current.

Next, the quantum well active layer 13 will be described. As shown in FIG. 8B, an InGaN layer formed on a substrate 11 of GaN has a critical thickness of 50 Å when the In composition ratio is 0.07, a critical thickness of 20 Å when the In composition ratio is 0.15, and a critical thickness of 10 Å when the In composition ratio is 0.30. Accordingly, when well layers each having an In composition ratio of 0.15 or more and a thickness greater than 30 Å are used as the quantum well active layer 13, lattice defects will be caused easily. Therefore, it is probably difficult to make a well layer have a thickness of 30 Å or more without causing lattice defects. In view of the band gap wavelength, it is recommended that InGaN having an In composition ratio of about 0.15 be used as a well layer for a blue laser element having a wavelength of 430 nm. In order to obtain a green laser element having a wavelength of 530 nm, InGaN having an In composition ratio of about 0.3 is suitably used. As described above, in view of the increases in operating current value, lasing threshold current, and operating voltage, the number of well layers is suitably three or less. Therefore, in a long wavelength range that exceeds the 430 nm wavelength band, the total thickness of the well layers becomes as small as about 90 Å, and it is difficult to increase the coefficient of light confinement in the vertical direction.

In order to increase the coefficient of light confinement in the vertical direction, it is effective to use, as barrier layers in the quantum well active layer 13, InGaN layers each having a greater refractive index than GaN and an In composition ratio of about 0.03 to 0.07. In this case, the critical thickness of each barrier layer is 150 Å when the In composition ratio is 0.03, and 50 Å when the In composition ratio is 0.07. In the first example, an In composition ratio of each barrier layer is set to be 0.05, when the critical thickness is 80 Å. Accordingly, when the InGaN barrier layer provided between the first cladding layer 12 of AlGaN and the InGaN well layer located nearest to the first cladding layer 12 has a thickness of about 100 Å or more, lattice defects will be caused easily in the quantum well electron barrier layer 315. It is also probable that lattice relaxation has already occurred at the interface between the barrier layer and the well layer. Since lattice relaxation causes the substantial lattice constant to approach the original value of an InGaN layer, the InGaN layer approaches a bulk state. Therefore, compositional separation as illustrated in FIG. 6 easily occurs in the InGaN well layers. In a green laser operating in the 530 nm wavelength band, InGaN layers used as well layers each have an In composition ratio of about 0.3. That is why compositional separation will have some influence on the laser element. Therefore, in the green laser operating in the 530 nm wavelength band, the barrier layer which contacts, at a point closer to the substrate 11, with one of the well layers that is located closer to the first cladding layer 12 than any other well layer is suitably a GaN layer in order to reduce the compositional separation. For example, a GaN layer may be formed over a barrier layer of $In_{0.05}Ga_{0.95}N$ having an In composition ratio of 0.05, and the barrier layer may have its lattice constant restored into that of GaN. And then, a layer of $In_{0.3}Ga_{0.7}N$ having an In composition ratio of 0.3 may be formed thereover. In this manner, it is possible to suppress the occurrence of compositional separation while enhancing the confinement of light in the vertical direction.

As shown in FIG. 8C, when an InAlN layer formed over the substrate 11 of GaN has an In composition ratio of around 0.17, the InAlN layer lattice-matches with GaN, and therefore, the critical thickness sharply increases. Therefore, by using such an InAlN layer having an In composition ratio in the vicinity of 0.17 as the refractive index correction layer 15, the occurrence of lattice defects as observed in the first cladding layer 12 can be suppressed. A layer of $In_{0.11}Al_{0.89}N$ having an In composition ratio of 0.11 and an Al composition ratio of 0.89 has a critical thickness of 50 Å. A layer of $In_{0.24}Al_{0.76}N$ having an In composition ratio of 0.24 and an Al composition ratio of 0.76 also has a critical thickness of 50 Å. This means that use of a plurality of InAlN layers each having an In composition ratio of 0.11 to 0.24 (and an Al composition ratio of 0.76 to 0.89) and a thickness of 50 Å or less as the refractive index correction layer 15 can suppress the occurrence of lattice defects. A layer of $In_{0.14}Al_{0.86}N$ having an In composition ratio of 0.14 and an Al composition ratio of 0.86 has a critical thickness of 130 Å. A layer of $In_{0.2}Al_{0.8}N$ having an In composition ratio of 0.2 and an Al composition ratio of 0.8 has a critical thickness of 110 Å. This means that use of a plurality of InAlN layers each having an In composition ratio of 0.14 to 0.2 (and an Al composition ratio of 0.8 to 0.86) and a thickness of 110 Å or less as the refractive index correction layer 15 can suppress the occurrence of lattice defects. The occurrence of lattice defects and compositional separation can be suppressed by using, as the refractive index correction layer 15, an InAlN/GaN superlattice structure which has a stack of a plurality of basic units each consisting of a GaN layer and an InAlN layer that falls within the composition ratio range and thickness range that allow no compositional separation as illustrated in FIG. 7, in a state where no lattice defects have occurred. This produces the significant effects of cutting down the waveguide propagation loss in the laser light distribution range and lowering the operating voltage. Further, when lattice matching is achieved such that the difference in lattice constant between InAlN and GaN is preferably 1% or less, more preferably 0.45% or less, and still more preferably 0.1% or less, piezoelectric voltage which is disadvantageously caused by lattice mismatch in a nitride semiconductor can be reduced. It is thus possible to reduce an increase in electric resistance caused by an electric potential barrier in an InAlN/GaN superlattice layer, and lower the operating voltage.

These effects would be achieved by not only an InAlN layer but also an InAlGaN layer including Ga. An AlGaN layer provided over a GaN layer has a critical thickness of 50 Å when its Al composition ratio is 0.4 and its Ga composition ratio is 0.6. An InGaN layer provided over a GaN layer has a critical thickness of 50 Å when its In composition ratio is 0.07 and its Ga composition ratio is 0.93.

Accordingly, the lattice defects and compositional separation can be suppressed by forming, over a GaN layer, an $In_{1-x-y}Al_yGa_xN$ layer having a thickness of 50 Å or less and satisfying the expressions, $x/1.08+y/0.91 \leq 1$ and $x/0.91+y/0.75 \geq 1$.

The occurrence of lattice defects and compositional separation can be suppressed by forming the refractive index correction layer 15 having an InAlGaN/GaN superlattice structure including a stack of a plurality of basic units each consisting of a GaN layer and the $In_{1-x-y}Al_yGa_xN$ layer that falls within the atomic composition ratio range and the thickness range. This produces the significant effect of cutting down the waveguide propagation loss in the laser light distribution range.

An AlGaN layer provided over a GaN layer has a critical thickness of 110 Å when its Al composition ratio is 0.18 and its Ga composition ratio is 0.82. An InGaN layer provided over a GaN layer has a critical thickness of 110 Å when its In composition ratio is 0.03 and its Ga composition ratio is 0.97.

Accordingly, the occurrence of lattice defects and compositional separation can be suppressed by forming, over the substrate 11 of GaN, an $In_{1-x-y}Al_yGa_xN$ layer having a thickness of 110 Å or less and satisfying the expressions $x/1.16+y/0.86 \leq 1$ and $x/0.97+y/0.8 \geq 1$ as the refractive index correction layer 15. The refractive index correction layer 15 having an InAlGaN/GaN superlattice structure including a stack of two or more basic units each consisting of a GaN layer and the $In_{1-x-y}Al_yGa_xN$ layer that falls within the atomic composition ratio range and the thickness range can suppress the occurrence of lattice defects and compositional separation. Therefore, the refractive index correction layer 15 having this structure produces the significant effect of cutting down the waveguide propagation loss in the laser light distribution range.

Further, when lattice matching is achieved such that the difference in lattice constant between InAlGaN and GaN is preferably 1% or less, more preferably 0.45% or less, and still more preferably 0.1% or less, piezoelectric voltage which is disadvantageously caused by lattice mismatch in a nitride semiconductor can be reduced. It is thus possible to reduce an increase in electric resistance caused by an electric potential barrier in an InAlGaN/GaN superlattice layer, and to lower the operating voltage.

Next, the atomic composition ratio range of InAlGaN which has, on the 430 nm wavelength band, a lower refractive index than a cladding layer having an Al composition ratio of 0.1 and a Ga composition ratio of 0.9 (i.e. an $Al_{0.1}Ga_{0.9}N$ cladding layer) will be described. The refractive index of AlGaN decreases as its Al composition ratio increases. InAlGaN having an Al composition ratio of greater than 0.1 has a lower refractive index than $Al_{0.1}Ga_{0.9}N$. InAlN having an Al composition ratio of 0.69 has a large refractive index as the $Al_{0.1}Ga_{0.9}N$ cladding layer. Therefore, InAlN within a composition ratio range in which the Al composition ratio is 0.69 or more has a lower refractive index than the $Al_{0.1}Ga_{0.9}N$ cladding layer. It is thus probable that $In_{1-x-y}Al_yGa_xN$ has a lower refractive index than the $Al_{0.1}Ga_{0.9}N$ cladding layer if $In_{1-x-y}Al_yGa_xN$ falls within the range represented by $x/1.05+y/0.69>1$. As described above, it is very difficult to use AlGaN having an Al composition ratio of 0.1 or more as a cladding layer, because use of such AlGaN would cause lattice defects and an increase in resistance.

Therefore, a refractive index correction layer 15 having a multilayered superlattice structure including: a GaN layer; and an $In_{1-x-y}Al_yGa_xN$ layer of which the thickness is 50 Å or less and the atomic composition ratio range satisfies $x/1.08+y/0.91 \leq 1$ and $x/0.91+y/0.75 \geq 1$; or an $In_{1-x-y}Al_yGa_xN$ layer of which the thickness is 110 Å or less and the atomic composition ratio range satisfies $x/1.04+y/0.87 \leq 1$, $x/0.96+y/0.81 \geq 1$, and $x/1.05+y/0.69>1$ will have a lower refractive index than an $Al_{0.1}Ga_{0.9}N$ cladding layer while suppressing the occurrence of lattice defects and compositional separation. Use of an $In_{1-x-y}Al_yGa_xN$ layer having atomic composition ratios falling within these ranges to form the refractive index correction layer can suppress the occurrence of lattice defects and compositional separation. Further, a refractive index correction layer 15 with low loss can be obtained by setting the thickness ratio of (the duty ratio) of the $In_{1-x-y}Al_yGa_xN$ layer such that the refractive index of the $In_{1-x-y}Al_yGa_xN$ layer becomes lower than that of an $Al_{0.1}Ga_{0.9}N$ layer.

Figure 9:
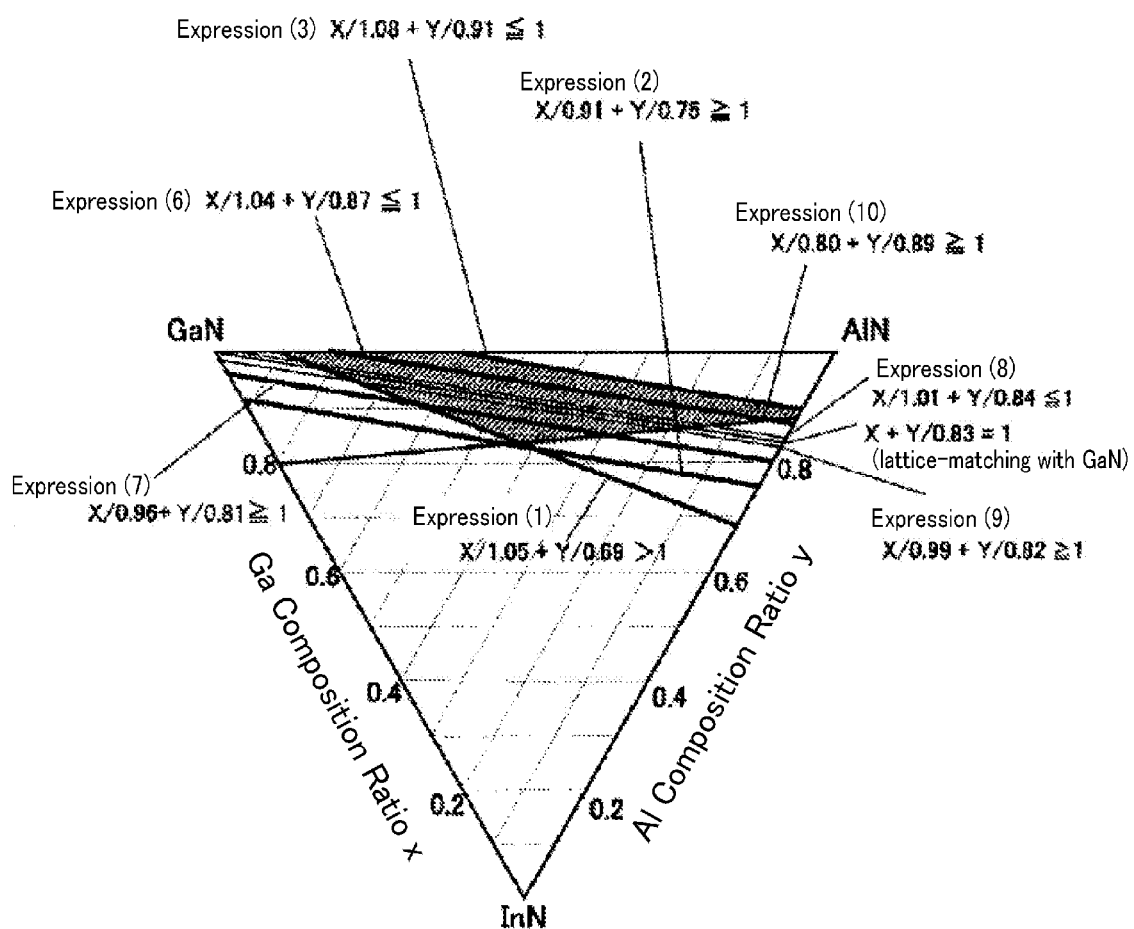
FIG. 9 illustrates a composition ratio setting region of another material for the first refractive index correction layer of the semiconductor light emitting element according to the embodiment.

In order to suppress the occurrence of compositional separation, if an $In_{1-x-y}Al_yGa_xN$ layer having a thickness of 50 Å or more is used as the refractive index correction layer 15, the $In_{1-x-y}Al_yGa_xN$ layer needs to have an atomic composition ratio range satisfying $x/0.80+y/0.89 \geq 1$, in addition to $x/1.08+y/0.91 \leq 1$ and $x/0.91+y/0.75 \geq 1$. This is because, once caused, the lattice defects cause lattice relaxation to the $In_{1-x-y}Al_yGa_xN$ layer, thus, allowing the $In_{1-x-y}Al_yGa_xN$ layer to approach a bulk state. This composition ratio range corresponds to the hatched region in FIG. 9.

Next, the thickness ratio (hereinafter referred to as a "duty ratio") of an $In_{1-x-y}Al_yGa_xN$ layer and a GaN layer included in the refractive index correction layer 15 will be described. If the thickness of the $In_{1-x-y}Al_yGa_xN$ layer in the refractive index correction layer 15 is indicated by A and the thickness of the GaN layer included in the refractive index correction layer 15 is indicated by B, the duty ratio is given by $A/(A+B)$%.

Figure 10:
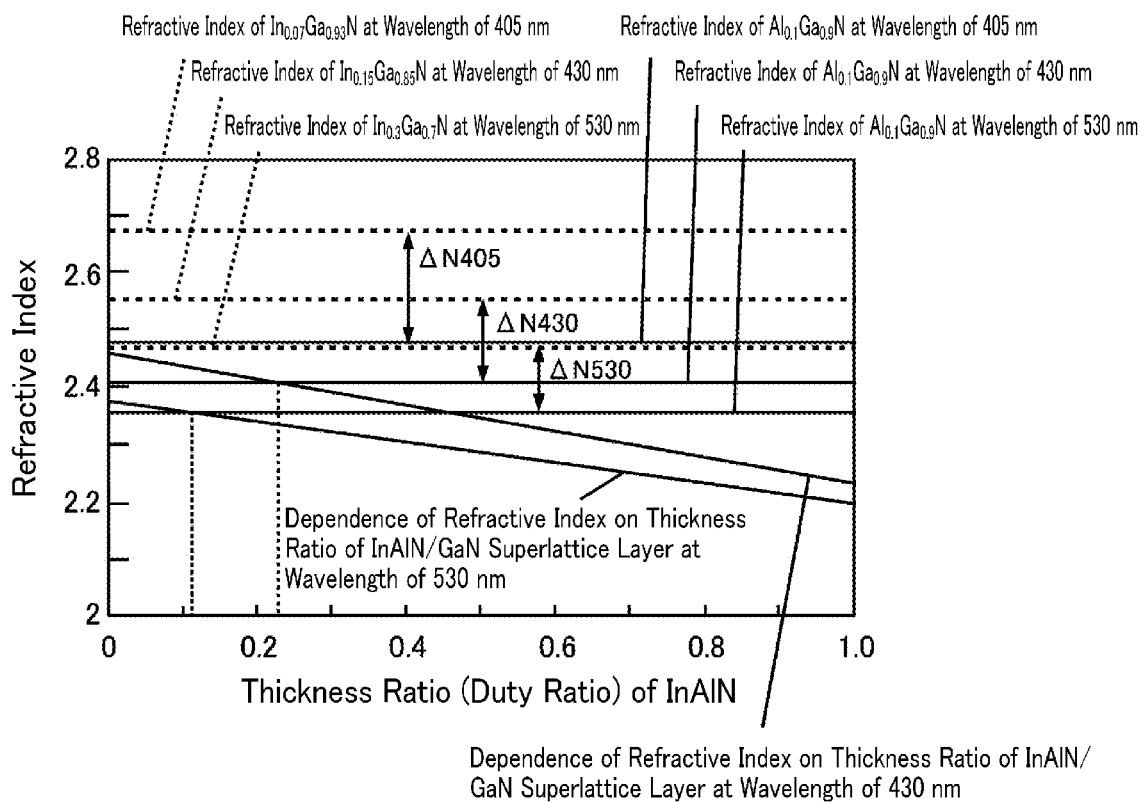
FIG. 10 shows the dependence of the refractive indices of InAlN on a thickness constituent ratio.

FIG. 10 shows the duty ratio dependence of the refractive index of $In_{0.17}Al_{0.83}N$ which lattice-matches with GaN and which has an In composition ratio of 0.17 and an Al composition ratio of 0.83, at wavelengths of 430 nm and 530 nm. In FIG. 10, solid lines indicate, for comparison purposes, the refractive indices that $Al_{0.1}Ga_{0.9}N$ with an Al composition ratio of 0.1 has at wavelengths of 430 nm and 530 nm. As shown in FIG. 10, on the 430 nm wavelength band, $In_{0.17}Al_{0.83}N$ has a lower refractive index than an $Al_{0.1}Ga_{0.9}N$ cladding layer if the duty ratio is 21% or more. On the 530 nm wavelength band, $In_{0.17}Al_{0.83}N$ has a lower refractive index than the $Al_{0.1}Ga_{0.9}N$ cladding layer if the duty ratio is 11% or more.

In FIG. 10, the dotted lines indicate, for comparison purposes, a refractive index of an $In_{0.07}Ga_{0.93}N$ layer which is suitable for achieving laser oscillation on the 405 nm wavelength band, a refractive index of an $In_{0.15}Ga_{0.85}N$ layer which is suitable for achieving laser oscillation on the 430 nm wavelength band, and a refractive index of an $In_{0.3}Ga_{0.7}N$ layer which is suitable for achieving laser oscillation on the 530 nm wavelength band. A refractive index of $Al_{0.1}Ga_{0.9}N$ at the wavelength of 405 nm is also shown for reference.

As shown in FIG. 10, the difference ΔN405 in refractive index between the well layer and the $Al_{0.1}Ga_{0.9}N$ layer at a wavelength of 405 nm is 0.20. The difference ΔN430 in refractive index at a wavelength of 430 nm is 0.15, and the difference ΔN530 in refractive index at a wavelength of 530 nm is 0.11.

As described above, if AlGaN is used to make a cladding layer, the difference in refractive index between a well layer and the AlGaN cladding layer narrows as the wavelength increases from 430 nm to 530 nm, and the coefficient of light confinement in the vertical direction decreases accordingly. Thus, a conventional laser structure in which only an AlGaN layer is used as a cladding layer has a small coefficient of light confinement in the vertical direction and will cause degradation in the temperature characteristics.

In contrast, a refractive index correction layer 15 with a superlattice structure including the $In_{0.17}Al_{0.83}N$ layer and the GaN layer can have a lower refractive index than an $Al_{0.1}Ga_{0.9}N$ cladding layer as shown in FIG. 10 on the 430 nm wavelength band when its duty ratio is set to be 21% or more. On the 530 nm wavelength band, the refractive index correction layer 15 can have a lower refractive index than the $Al_{0.1}Ga_{0.9}N$ cladding layer when its duty ratio is set to be 11% or more.

FIG. 11A illustrates the duty ratio dependence of the refractive index that a refractive index correction layer 15 formed out of an $In_{0.24}Al_{0.76}N$ layer has at a wavelength of 430 nm, and the duty ratio dependence of the refractive index that a refractive index correction layer 15 with a superlattice structure including an $In_{0.11}Al_{0.89}N$ layer and a GaN layer has at a wavelength of 430 nm. On the 430 nm wavelength band, the refractive index of the $In_{0.24}Al_{0.76}N$ layer becomes lower than that of an $Al_{0.1}Ga_{0.9}N$ layer at a duty ratio of 33% or more. On the 430 nm wavelength band, the refractive index of the $In_{0.11}Al_{0.89}N$ layer becomes lower than that of the $Al_{0.1}Ga_{0.9}N$ layer at a duty ratio of 12% or more. Therefore, if the duty ratio of a superlattice layer including an InAlN layer having an Al composition ratio of 0.76 to 0.89 and a GaN layer is set to be 33% or more, the superlattice layer has a lower refractive index than an $Al_{0.1}Ga_{0.9}N$ layer. Thus, the superlattice layer advantageously serves as a refractive index correction layer 15 that will cause little loss and no lattice defects or no compositional separation.

FIG. 11B shows the duty ratio dependence of the refractive index which a refractive index correction layer 15 formed out of an $In_{0.24}Al_{0.76}N$ layer has at a wavelength of 530 nm, and the duty ratio dependence of the refractive index which a refractive index correction layer 15 with a superlattice structure including an $In_{0.11}Al_{0.89}N$ layer and a GaN layer has at a wavelength of 530 nm. On the 530 nm wavelength band, the refractive index of the $In_{0.24}Al_{0.76}N$ layer becomes lower than that of an $Al_{0.1}Ga_{0.9}N$ layer at a duty ratio of 19% or more. On the 530 nm wavelength band, the refractive index of the $In_{0.11}Al_{0.89}N$ layer becomes lower than that of the $Al_{0.1}Ga_{0.9}N$ layer at a duty ratio of 5% or more. Therefore, if the duty ratio of a superlattice layer including an InAlN layer having an Al composition ratio of 0.76 to 0.89 and a GaN layer is set to be 19% or more, the superlattice layer has a lower refractive index than an $Al_{0.1}Ga_{0.9}N$ layer.

Figure 12A:
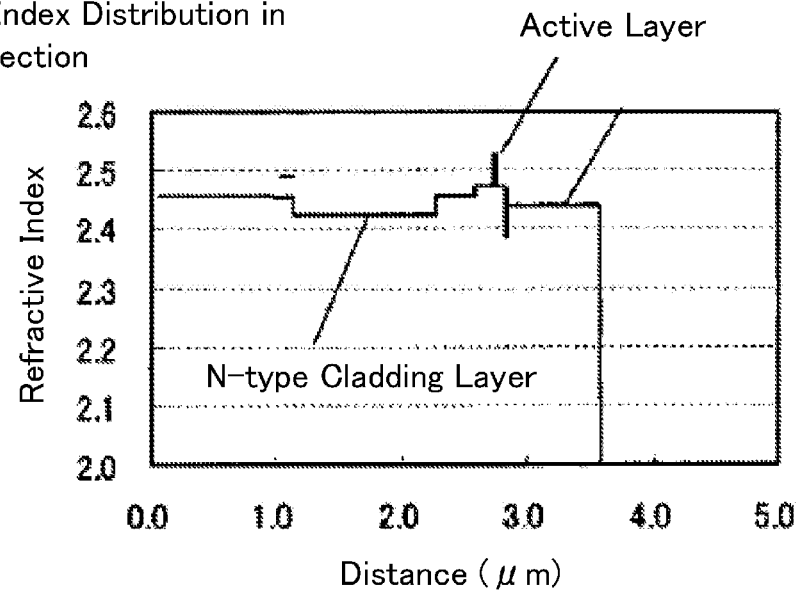
FIG. 12A shows results of calculation of a refractive index distribution in a conventional semiconductor light emitting element.
Figure 12B:
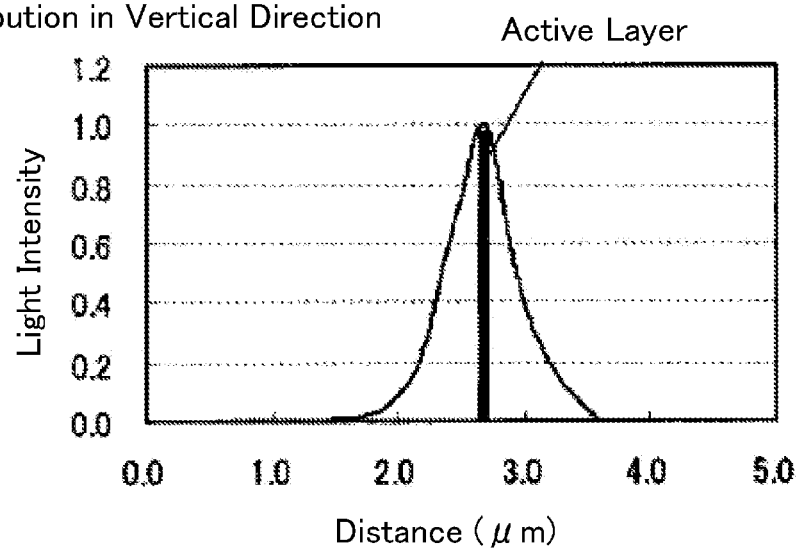
FIG. 12B shows results of calculation of a light distribution in a vertical direction in the conventional semiconductor light emitting element.
Figure 13A:
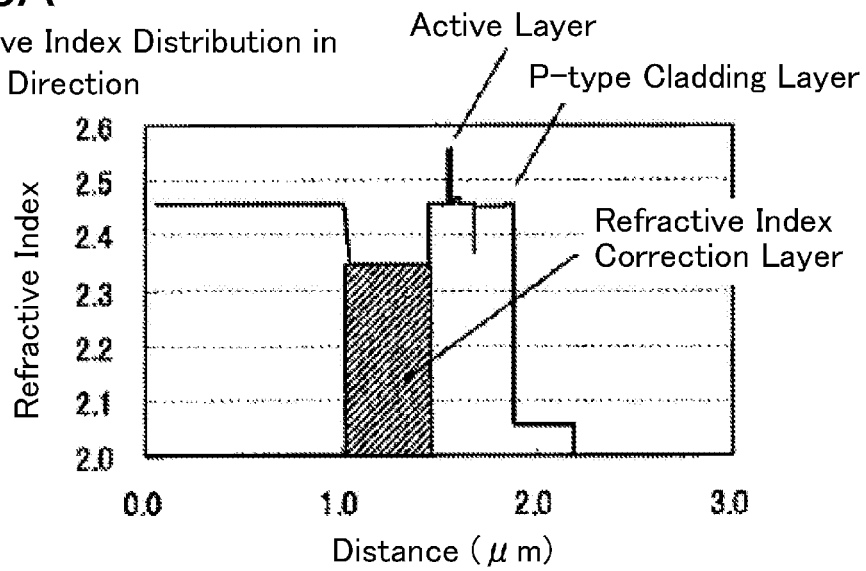
FIG. 13A shows results of calculation of a refractive index distribution in a semiconductor light emitting element according to the embodiment.
Figure 13B:
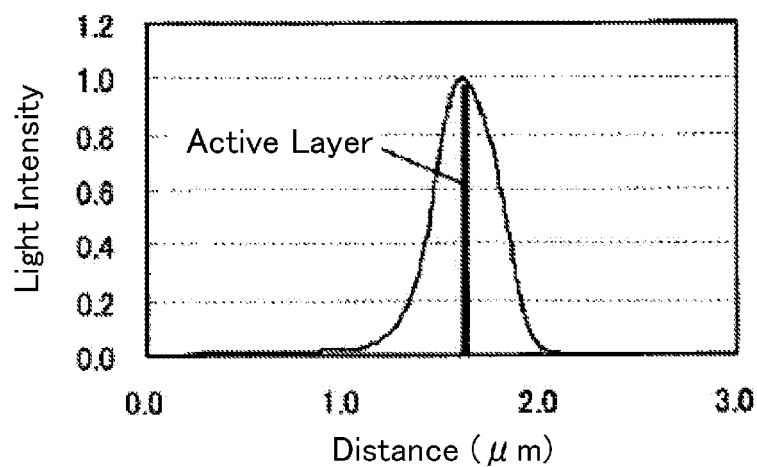
FIG. 13B shows results of calculation of a light distribution in a vertical direction in the semiconductor light emitting element according to the embodiment.

According to the first example, the refractive index correction layer 15 is a superlattice layer having a thickness of 5 μm (and a duty ratio of 50%) and including an $In_{0.17}Al_{0.83}N$ layer having a thickness of 30 Å and a GaN layer having a thickness of 30 Å. A conventional structure in which only an AlGaN layer is used as a cladding layer has a refractive index distribution in the vertical direction and a light distribution in the vertical direction as shown in FIGS. 12A and 12B. The coefficient of light confinement in the vertical direction of the conventional structure is calculated to be 1.1%. On the other hand, the structure according to the first example has a refractive index distribution in the vertical direction and a light distribution in the vertical direction as shown in FIGS. 13A and 13B. The coefficient of light confinement in the vertical direction of the structure of the first example is calculated to be 1.8%. That is to say, the coefficient of light confinement in the vertical direction of the first example is increased to about 1.6 times as high a value as that of the conventional structure. Consequently, the high-temperature operation characteristics are improved, the thermally saturated optical output is increased, and the operating current value is reduced during a high-temperature operation. The refractive index correction layer 15 can suppress the occurrence of lattice defects in the first cladding layer 12 as well as the occurrence of lattice defects in the layers to be grown over the refractive index correction layer 15. Accordingly, lattice relaxation will be caused less easily, and the occurrence of compositional separation in an active layer including InGaN can also be reduced. In addition, the slope efficiency and the temperature characteristics can also be improved.

In order to form an InAlN/GaN superlattice layer and an InAlGaN/GaN superlattice layer, an InAlN layer and an InAlGaN layer which have an In composition ratio as high as about 17% need to be formed. Accordingly, to increase efficiency with which In atoms are incorporated into a crystal-growing layer, the thickness of the crystal-growing layer per unit time (a crystal growth rate) needs to be lower than that of an AlGaN layer. Therefore, by using an AlGaN layer having a high crystal growth rate as a portion of the cladding layer, the time it takes to form the entire element structure through crystal growth can be shortened, and therefore, the manufacturing cost of the element can be cut down and its mass productivity can be increased.

Second Example

A semiconductor light emitting element according to a second example of the present disclosure has the same structure as the first example illustrated in FIG. 1 except that the quantum well active layer 13 includes InGaN well layers each having an In composition ratio of 0.3 in order to achieve laser oscillation on the 530 nm band. The well layers form a TQW structure, and each have a thickness of 25 Å in order to suppress the occurrence of lattice defects.

The atomic composition ratio range of a refractive index correction layer 15 formed out of an $In_{1-x-y}Al_yGa_xN$ layer which has, on the 530 nm wavelength band, a lower refractive index than a first cladding layer 12 of $Al_{0.1}Ga_{0.9}N$ will be now described. The refractive index of AlGaN decreases as its Al composition ratio increases. Therefore, AlGaN having an Al composition ratio of greater than 0.1 has a lower refractive index than a layer made of $Al_{0.1}Ga_{0.9}N$ (an $Al_{0.1}Ga_{0.9}N$ cladding layer). InAlN having an Al composition ratio of 0.49 has as high a refractive index as the $Al_{0.1}Ga_{0.9}N$ cladding layer. Accordingly, InAlN within a composition ratio range where its Al composition ratio is 0.49 or more has a lower refractive index than the $Al_{0.1}Ga_{0.9}N$ cladding layer. It is thus probable that $In_{1-x-y}Al_yGa_xN$ has a lower refractive index than the $Al_{0.1}Ga_{0.9}N$ cladding layer when $In_{1-x-y}Al_yGa_xN$ falls within in the range represented by $x/1.13 + y/0.49 \geq 1$. As described above, it is very difficult to use AlGaN having an Al composition ratio of 0.1 or more as a cladding layer since use of such AlGaN would cause lattice defects and an increase in resistance.

Therefore, the refractive index correction layer 15 with a multi-layered superlattice layer including: a GaN layer; and an $In_{1-x-y}Al_yGa_xN$ layer of which the thickness is 50 Å or less and the atomic composition ratio range satisfies $x/1.08+y/0.91 \le 1$ and $x/0.91+y/0.75 \ge 1$; or an $In_{1-x-y}Al_yGa_xN$ layer of which the thickness is 110 Å or less and the atomic composition ratio range satisfies $x/1.04+y/0.87 \le 1$, $x/0.96+y/0.81 \ge 1$, and $x/1.13+y/0.49 > 1$ will have a lower refractive index than an $Al_{0.1}Ga_{0.9}N$ cladding layer and will suppress the occurrence of lattice defects and compositional separation. Use of an $In_{1-x-y}Al_yGa_xN$ layer having atomic composition ratios falling within these ranges to form the refractive index correction layer 15 can suppress the occurrence of lattice defects and compositional separation. Further, the refractive index correction layer 15 that will cause little loss can be obtained by setting the duty ratio of the $In_{1-x-y}Al_yGa_xN$ layer such that the refractive index of the $In_{1-x-y}Al_yGa_xN$ layer becomes lower than that of an $Al_{0.1}Ga_{0.9}N$ layer.

Figure 14:
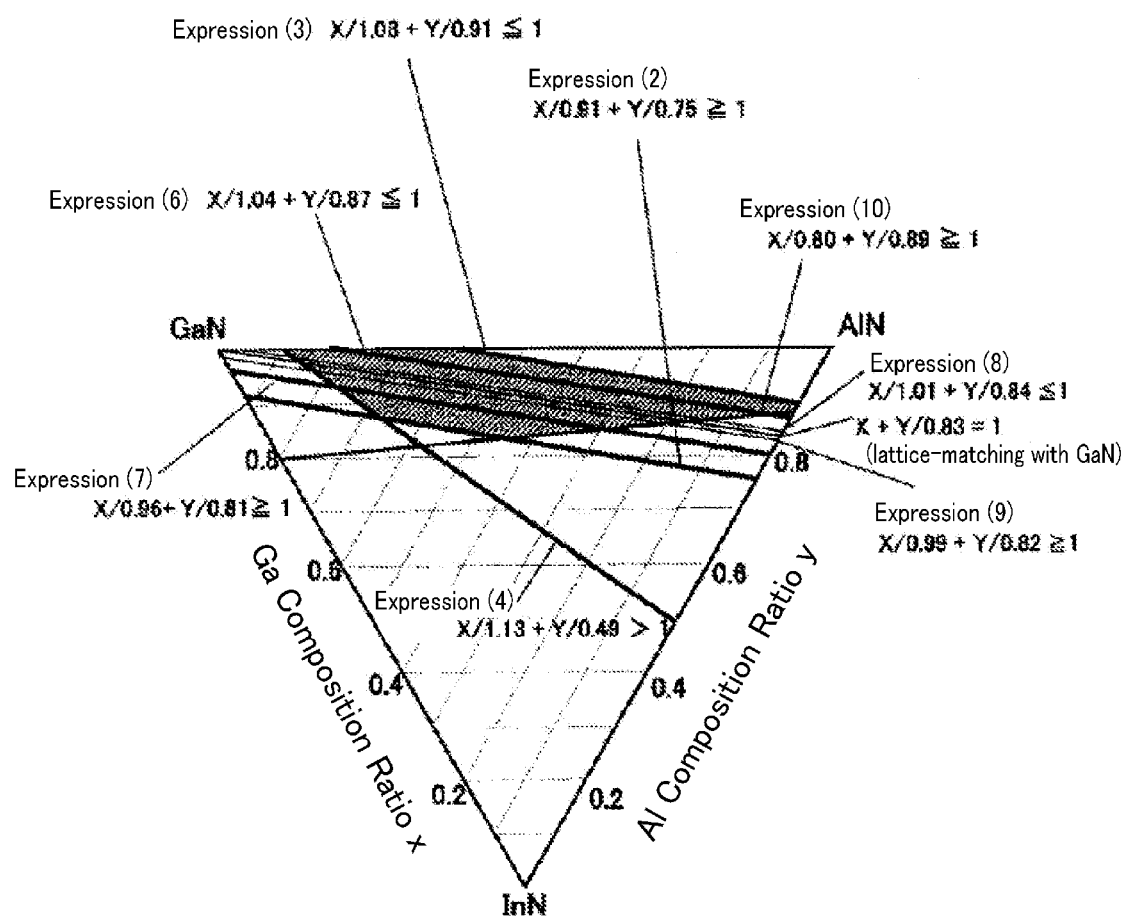
FIG. 14 illustrates a composition ratio setting region of another material for the first refractive index correction layer of the semiconductor light emitting element according to the embodiment.

In order to suppress the occurrence of compositional separation, an $In_{1-x-y}Al_yGa_xN$ layer having a thickness of 50 Å or more and falling within an atomic composition ratio range satisfying $x/1.08+y/0.91 \le 1$ and $x/0.91+y/0.75 \ge 1$ suitably satisfy the range that is represented by $x/0.8+y/0.89 \ge 1$ and corresponds to the hatched region in FIG. 14.

According to the second example, the refractive index correction layer 15 is a superlattice layer having a thickness of 0.7 μm (and a duty ratio of 50%) and including an $In_{0.17}Al_{0.83}N$ layer having a thickness of 30 Å and a GaN layer having a thickness of 30 Å. A conventional structure in which only an AlGaN layer is used as a cladding layer has a coefficient of light confinement in the vertical direction of 0.8%. On the other hand, the coefficient of light confinement in the vertical direction of the structure according to the second example is 1.5%, i.e., about twice as high as that of the conventional structure. Consequently, the high-temperature operation characteristics are improved, the thermally saturated optical output is increased, and the operating current value is reduced during a high-temperature operation. The refractive index correction layer 15 can suppress the occurrence of lattice defects in the first cladding layer 12 as well as the occurrence of lattice defects in the layers to be grown over the refractive index correction layer 15. Accordingly, lattice relaxation will be caused less easily, and the occurrence of compositional separation in an active layer including InGaN can also be reduced. Thus, the slope efficiency and the temperature characteristics can also be improved.

Third Example

Figure 15:
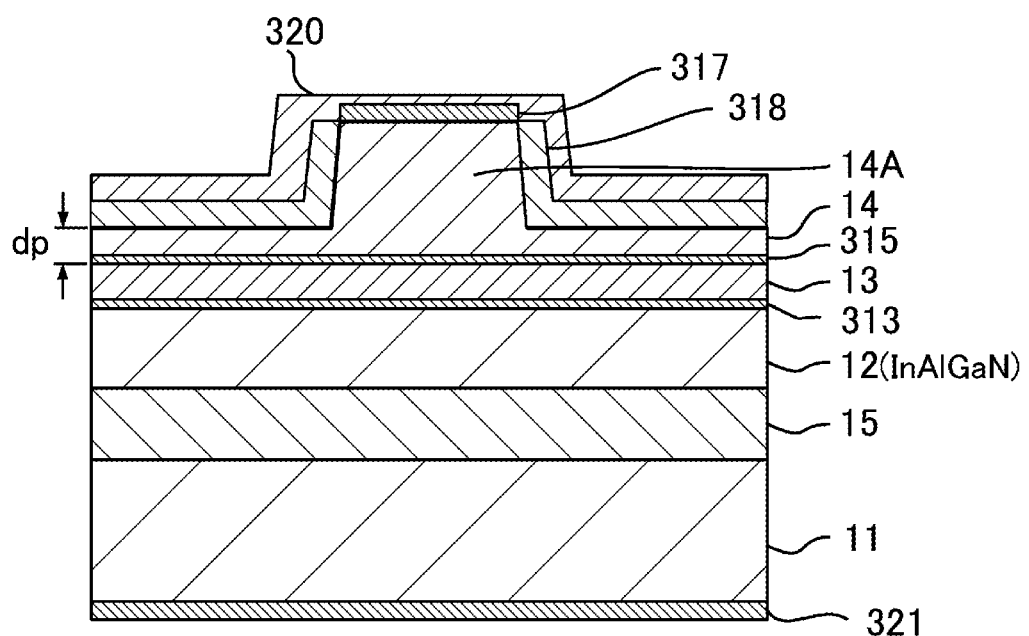
FIG. 15 is a cross-sectional view of a semiconductor light emitting element according to a third example.

A semiconductor light emitting element according to a third example of the present disclosure includes a first cladding layer 12 made of InAlGaN instead of AlGaN, as illustrated in FIG. 15. The other members are the same as the counterparts of the first or second example. With this configuration of the third example, it is also possible to suppress the occurrence of lattice defects and compositional separation, and to obtain a refractive index correction layer 15 with low loss and increase the coefficient of light confinement in the vertical direction.

Fourth Example

Figure 16:
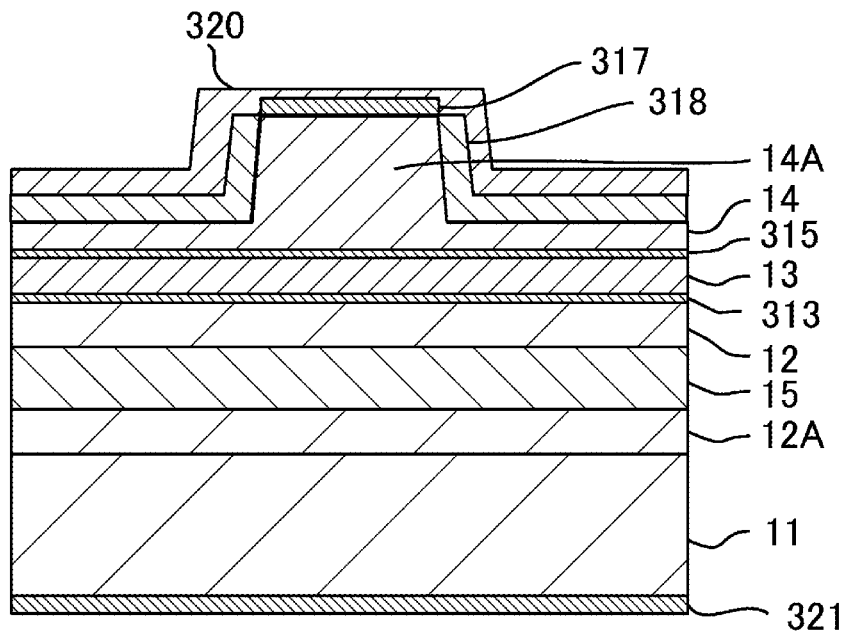
FIG. 16 is a cross-sectional view of a semiconductor light emitting element according to a fourth example.

A semiconductor light emitting element according to a fourth example of the present disclosure includes a third cladding layer 12A between a refractive index correction layer 15 and a substrate 11, as illustrated in FIG. 16. The other members of the fourth example are the same as the counterparts of the first to third examples.

Just like the first cladding layer 12, the third cladding layer 12A just needs to be a layer of $In_{1-n1-n2}Al_{n2}Ga_{n1}N$ (where $0 \le n1 < 1$, $0 < n2 < 1$, and $n1+n2 \le 1$). However, the third cladding layer 12A and the first cladding layer 12 do not have to have the same composition.

As already described for the first example, forming the refractive index correction layer 15 in contact with the substrate 11 enhances the effect of reducing the lattice mismatch. On the other hand, according to the structure of this example, the thickness of the second cladding layer 12 can be adjusted more easily. This example is advantageous in that lattice mismatch can be reduced and that the degree of the light confinement in the vertical direction can be adjusted.

Fifth Example

Figure 17:
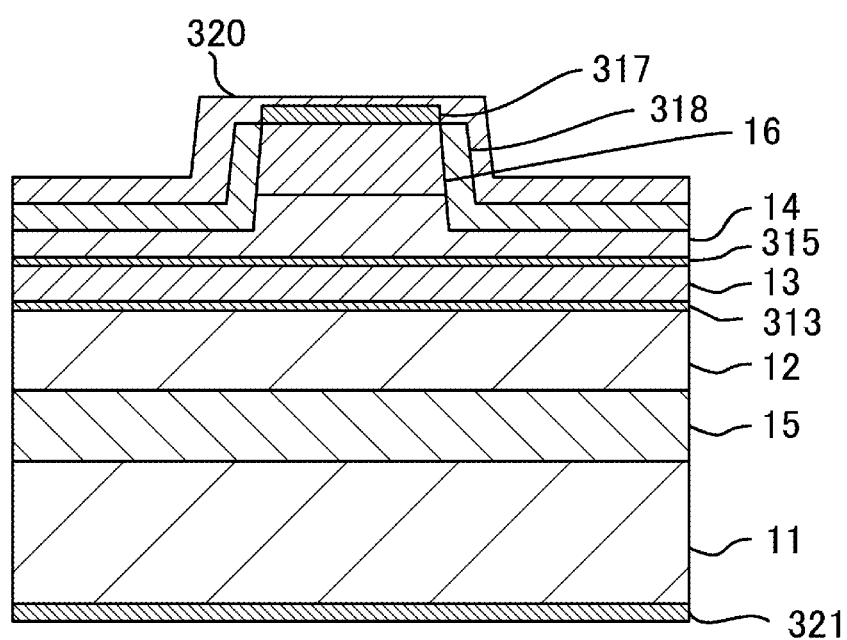
FIG. 17 is a cross-sectional view of a semiconductor light emitting element according to a fifth example.

A semiconductor light emitting element according to a fifth example of the present disclosure includes a second refractive index correction layer 16 between a second cladding layer 14 and a contact layer 317 as illustrated in FIG. 17. The other members of the fifth example are the same as the counterparts of the first or second example.

The second refractive index correction layer 16 is of the second conductivity type, i.e., p-type according to this example. As in the refractive index correction layer 15, the second refractive index correction layer 16 also includes $In_{1-x-y}Al_yGa_xN$ of which the range of the Al composition ratio y and Ga composition ratio x is the same as that of the refractive index correction layer 15. For example, if the wavelength is 430 nm or more, the composition ratio range satisfies not only Expression (1) but also any of the three sets of Expressions (2) and (3), Expressions (6) and (7), and Expressions (8) and (9), or Expression (10). If the wavelength is 530 nm or more, the composition ratio range has only to satisfy Expression (4) instead of Expression (1). If the wavelength is 630 nm or more, the composition ratio range just needs to satisfy Expression (5) instead of Expression (1). Further, the second refractive index correction layer 16 may be a superlattice layer. However, the composition ratios of the refractive index correction layer 15 do not have to be the same as those of the second refractive index correction layer 16.

With this configuration, it is also possible to prevent light from reaching the contact layer 317 and to cut down the waveguide propagation loss, besides achieving the effects of confining light and reducing the lattice mismatch as already stated for the first example.

Figure 18:
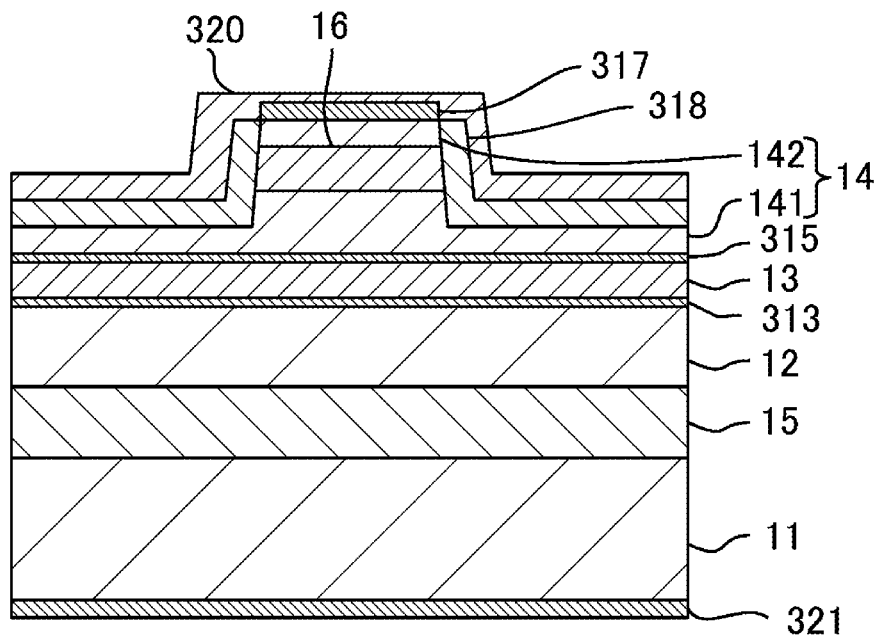
FIG. 18 is a cross-sectional view of a semiconductor light emitting element according to a variation of the fifth example.

As illustrated in FIG. 18, the light emitting element may also be configured such that the second cladding layer 14 includes a first layer 141 and a second layer 142 and that the second refractive index correction layer 16 is arranged between the first layer 141 and the second layer 142 of the second cladding layer 14. With this configuration, it is also possible to achieve the effect of cutting down the loss of light propagating through the waveguide. The configuration of FIG. 17 in which the second refractive index correction layer 16 is arranged right under the contact layer 317 can cut down the loss of light propagating through the waveguide more effectively than the configuration described above.

Figure 19:
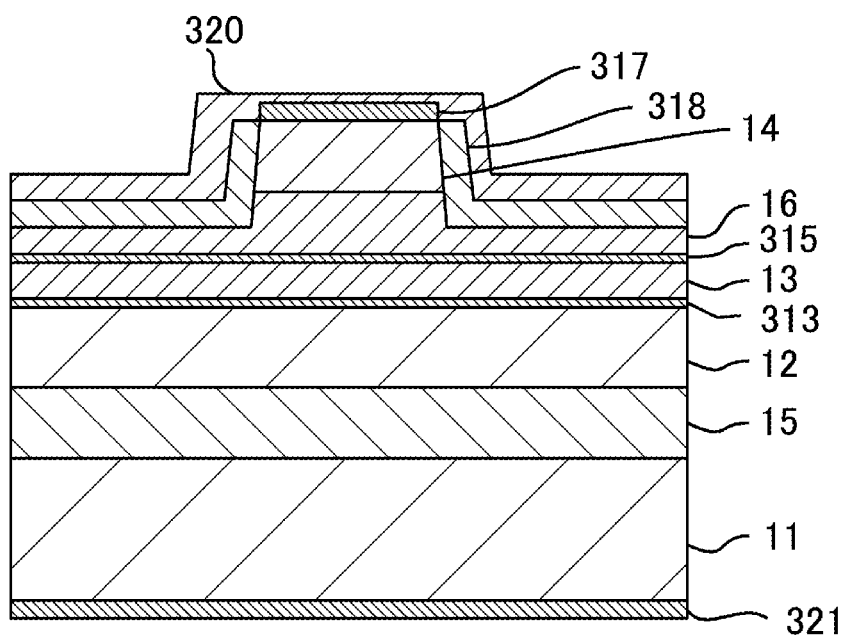
FIG. 19 is a cross-sectional view of a semiconductor light emitting element according to a variation of the fifth example.

As illustrated in FIG. 19, the light emitting element may also be configured such that the second refractive index correction layer 16 is arranged between the second cladding layer 14 of AlGaN and the quantum well active layer 13. With this configuration, the effect of confining light as stated for the first example can be achieved even more significantly and the effect of cutting down the loss of light propagating through the waveguide can be also be achieved.

Though the first through fifth examples described above include the first cladding layer 12 made of AlGaN, this is only an example. Alternatively, the first cladding layer 12 may be made of GaN.

The reason is as follows. The refractive index of the refractive index correction layer 15 is lower than that of $Al_{0.1}Ga_{0.9}N$ having an Al composition ratio of 0.1. Accordingly, even with the first cladding layer 12 made of GaN, it is still possible to increase the coefficient of light confinement in the vertical direction within the quantum well active layer 13.

Further, the first cladding layer 12 made of a GaN layer lattice-matches with the substrate 11 of GaN, and the thermal expansion coefficient of the former is identical to that of the latter. Therefore, the occurrence of lattice defects can be further suppressed, compared to a situation where the first cladding layer 12 is an AlGaN layer. Thus, with the first cladding layer 12 made of a GaN layer, it is possible to curb an increase in the waveguide propagation and a decrease in long-term reliability.

In the light emitting element of the fourth example illustrated in FIG. 16, the first cladding layer 12 may be made of a GaN layer, and the third cladding layer 12A provided between the refractive index correction layer 15 and the substrate 11 may be made of an AlGaN layer that has a lower refractive index than GaN. With this configuration, it is possible to attenuate the light distribution between the refractive index correction layer 15 and the substrate 11 of GaN with even higher probability. Once the light distribution has reached the substrate 11, which is made of GaN having a high refractive index, the intensity of the light attenuates less easily, which could cause disturbance in the beam emission pattern (the far-field pattern) of the emitted laser light and decrease in optical coupling efficiency with an optical element such as a lens. In particular, with use of the refractive index correction layer 15 having a thickness of 0.5 μm or less and the third cladding layer 12A made of an AlGaN layer, the light distribution can be attenuated just as intended between the refractive index correction layer 15 and the substrate 11 of GaN. As a result, it is possible to ensure the confinement of light while reducing an increase in manufacturing costs that could be caused when it takes a longer time to form a thicker refractive index correction layer 15 by crystal growth.

Although, the first cladding layer 12 of the fifth example is supposed to be an AlGaN layer, this is only an example. Alternatively, the first cladding layer 12 may also be a GaN layer.

The reason is as follows. The second refractive index correction layer 16 has a lower refractive index than $Al_{0.1}Ga_{0.9}N$ having an Al composition ratio of 0.1. That is why, even with the first cladding layer 12 made of a GaN layer, it is still possible to increase the coefficient of light confinement in the vertical direction within the quantum well active layer 13. Further, the first cladding layer 12 made of a GaN layer lattice-matches with the GaN substrate, and the thermal expansion coefficient of the former is identical to that of the latter. Therefore, the occurrence of lattice defects can be further suppressed, as compared to a situation where the first cladding layer 12 is made of an AlGaN layer. Thus, with the first cladding layer 12 made of a GaN layer, it is possible to curb an increase in the loss of light propagating through the waveguide and decrease in long-term reliability.

The semiconductor light emitting element of the present disclosure can not only reduce the lattice mismatch between the substrate and the first cladding layer, but also confine the light in the vertical direction at the same time, and therefore, can be used particularly effectively as a light source for a projector, for example.

What is claimed is:

1. A semiconductor light emitting element, comprising:
   a substrate including GaN;
   a first cladding layer of a first conductivity type provided over the substrate and including $In_{1-n1-n2}Al_{n2}Ga_{n1}N$ (where $0<n1<1$, $0\leq n2<1$, and $n1+n2\leq 1$);
   a quantum well active layer provided over the first cladding layer;
   a second cladding layer of a second conductivity type provided over the quantum well active layer and including $In_{1-m1-m2}Al_{m2}Ga_{m1}N$ (where $0<m1<1$, $0<m2<1$, and $m1+m2\leq 1$); and
   a first refractive index correction layer of the first conductivity type provided between the substrate and the first cladding layer, wherein
   the first refractive index correction layer includes a layer of $In_{1-x-y}Al_yGa_xN$ (where $x+y<1$),
   x and y satisfy the relations $x/1.05+y/0.69>1$, $x/0.91+y/0.75\geq 1$, and $x/1.08+y/0.91\leq 1$, and
   the quantum well active layer has an emission wavelength of equal to or greater than 430 nm.

2. A semiconductor light emitting element, comprising:
   a substrate including GaN;
   a first cladding layer of a first conductivity type provided over the substrate and including $In_{1-n1-n2}Al_{n2}Ga_{n1}N$ (where $0<n1<1$, $0\leq n2<1$, and $n1+n2\leq 1$);
   a quantum well active layer provided over the first cladding layer;
   a second cladding layer of a second conductivity type provided over the quantum well active layer and including $In_{1-m1-m2}Al_{m2}Ga_{m1}N$ (where $0<m1<1$, $0<m2<1$, and $m1+m2\leq 1$); and
   a first refractive index correction layer of the first conductivity type provided between the substrate and the first cladding layer, wherein
   the first refractive index correction layer includes a layer of $In_{1-x-y}Al_yGa_xN$ (where $x+y<1$),
   x and y satisfy the relations $x/1.13+y/0.49>1$, $x/0.91+y/0.75\geq 1$, and $x/1.08+y/0.91\leq 1$, and
   the quantum well active layer has an emission wavelength of equal to or greater than 530 nm.

3. A semiconductor light emitting element, comprising:
   a substrate including GaN;
   a first cladding layer of a first conductivity type provided over the substrate and including $In_{1-n1-n2}Al_{n2}Ga_{n1}N$ (where $0<n1<1$, $0\leq n2<1$, and $n1+n2\leq 1$);
   a quantum well active layer provided over the first cladding layer;
   a second cladding layer of a second conductivity type provided over the quantum well active layer and including $In_{1-m1-m2}Al_{m2}Ga_{m1}N$ (where $0<m1<1$, $0<m2<1$, and $m1+m2\leq 1$); and
   a first refractive index correction layer of the first conductivity type provided between the substrate and the first cladding layer, wherein
   the first refractive index correction layer includes a layer of $In_{1-x-y}Al_yGa_xN$ (where $x+y<1$),
   x and y satisfy the relations $x/1.54+y/0.24>1$, $x/0.91+y/0.75\geq 1$, and $x/1.08+y/0.91\leq 1$, and
   the quantum well active layer has an emission wavelength of equal to or greater than 630 nm.

4. The semiconductor light emitting element of claim 1, wherein
x and y satisfy the relations $x/0.96+y/0.81 \geq 1$ and $x/1.04+y/0.87 \leq 1$.

5. The semiconductor light emitting element of claim 1, wherein
x and y satisfy the relations $x/0.99+y/0.82 \geq 1$ and $x/1.01+y/0.84 \leq 1$.

6. The semiconductor light emitting element of claim 1, wherein
x and y satisfy the relation $x/0.80+y/0.89 \geq 1$.

7. The semiconductor light emitting element of claim 1, wherein
the first refractive index correction layer is a superlattice layer having a multi quantum well structure including the layer of $In_{1-x-y}Al_yGa_xN$ and a GaN layer.

8. The semiconductor light emitting element of claim 1, wherein
x is 0.

9. The semiconductor light emitting element of claim 1, further comprising:
a third cladding layer between the first refractive index correction layer and the substrate.

10. The semiconductor light emitting element of claim 9, wherein
the first cladding layer includes GaN and the third cladding layer includes AlGaN.

11. The semiconductor light emitting element of claim 1, further comprising:
a second refractive index correction layer provided over the second cladding layer.

12. The semiconductor light emitting element of claim 1, further comprising:
a second refractive index correction layer provided over the quantum well active layer, wherein
the second cladding layer includes a first layer and a second layer, and
the second refractive index correction layer is arranged between the first layer and the second layer.

13. The semiconductor light emitting element of claim 1, further comprising:
a second refractive index correction layer provided between the quantum well active layer and the second cladding layer.

14. The semiconductor light emitting element of claim 2, further comprising:
a second refractive index correction layer provided over the second cladding layer.

15. The semiconductor light emitting element of claim 2, further comprising:
a second refractive index correction layer provided over the quantum well active layer, wherein
the second cladding layer includes a first layer and a second layer, and
the second refractive index correction layer is arranged between the first layer and the second layer.

16. The semiconductor light emitting element of claim 2, further comprising:
a second refractive index correction layer provided between the quantum well active layer and the second cladding layer.

17. The semiconductor light emitting element of claim 3, further comprising:
a second refractive index correction layer provided over the second cladding layer.

18. The semiconductor light emitting element of claim 3, further comprising:
a second refractive index correction layer provided over the quantum well active layer, wherein
the second cladding layer includes a first layer and a second layer, and
the second refractive index correction layer is arranged between the first layer and the second layer.

19. The semiconductor light emitting element of claim 3, further comprising:
a second refractive index correction layer provided between the quantum well active layer and the second cladding layer.

* * * * *